United States Patent [19]

Tanaka et al.

[11] Patent Number: 5,270,714
[45] Date of Patent: Dec. 14, 1993

[54] ENCODING AND DECODING CIRCUIT FOR RUN-LENGTH-LIMITED CODING

[75] Inventors: Hiroyuki Tanaka, Kawasaki; Hirosi Uno, Yokohama, both of Japan

[73] Assignee: Fujitsu Limited, Kanagawa, Japan

[21] Appl. No.: 578,916

[22] Filed: Sep. 7, 1990

[30] Foreign Application Priority Data

Sep. 8, 1989 [JP] Japan .................. 1-233184
Sep. 8, 1989 [JP] Japan .................. 1-233185
Sep. 13, 1989 [JP] Japan .................. 1-238087

[51] Int. Cl.⁵ .................. H03M 5/16; H03M 7/20; H03M 7/46; G11B 5/09
[52] U.S. Cl. .................. 341/59; 341/57; 341/100; 341/101; 341/102; 341/106; 360/40
[58] Field of Search .......... 341/100, 101, 106, 102, 341/51, 57, 59; 360/39, 40, 51

[56] References Cited

U.S. PATENT DOCUMENTS

| Re. 30,182 | 12/1979 | Howson | 341/57 X |
|---|---|---|---|
| 4,413,251 | 11/1983 | Adler et al. . | |
| 4,488,142 | 12/1984 | Franaszek et al. . | |
| 4,496,934 | 1/1985 | Furukawa | 341/106 X |
| 4,551,773 | 11/1985 | Cohn et al. . | |
| 4,577,180 | 3/1986 | Fukuda | 341/106 X |
| 4,598,267 | 7/1986 | Fukuda | 341/58 |
| 4,864,303 | 9/1989 | Ofek | 341/106 X |
| 4,866,544 | 9/1989 | Hashimoto . | |

FOREIGN PATENT DOCUMENTS 0271317 6/1988 European Pat. Off. .
58-146129 2/1982 Japan .
58-119273 7/1983 Japan .
61-250875 11/1986 Japan .
63-7051 2/1988 Japan .
63-49789 3/1988 Japan .
63-144464 6/1988 Japan .
63-144465 6/1988 Japan .
1-133095 5/1989 Japan .

*Primary Examiner*—Sharon D. Logan
*Attorney, Agent, or Firm*—Nikaido, Marmelstein, Murray & Oram

[57] ABSTRACT

An encoding circuit converts successive bits of the original data to successive bits of coded data at a coding rate equal to m/n, where m and n are each an integer satisfying m<n, in accordance with a rule of a run-length-limited coding system and contains an encoder which inputs parallel m bits of the original data, and outputs parallel n bits of coded data corresponding to the input. Successive bits of data which are to be encoded are cyclically divided into a plurality of groups, and the data in the plurality of groups are input in a plurality of shift registers, respectively. Each of the plurality of shift registers simultaneously supplied a part of the m bits of the input to the encoder, synchronizing with a clock. The n bits of the output of the encoder is received in parallel in another shift register, and are serially output from the shift register, synchronizing with a second clock. The circuit reduces the maximum required frequency value of its internal clock by operating with only two clock signals. A decoding circuit converts the coded data to the original data.

16 Claims, 20 Drawing Sheets

Fig.1
PRIOR ART

|  | PRESENT DATA b0 b1 | NEXT DATA b2 b3 | CODED DATA s0 s1 s2 |
|---|---|---|---|
| WHEN LAST BIT OF PRECEDING DATA IS 0 | 1 0 | 0 X | 1 0 1 |
|  | 1 0 | 1 X | 0 1 0 |
|  | 1 1 | 0 0 | 0 1 0 |
|  | 1 1 | $\overline{0\ 0}$ | 1 0 0 |
|  | 0 0 | 0 X | 0 0 1 |
|  | 0 0 | 1 X | 0 0 0 |
|  | 0 1 | 0 X | 0 0 1 |
|  | 0 1 | 1 X | 0 0 0 |
| WHEN LAST BIT OF PRECEDING DATA IS 1 | 0 0 | 0 X | 0 0 1 |
|  | 0 0 | 1 X | 0 1 0 |
|  | 0 1 | 0 0 | 0 1 0 |
|  | 0 1 | $\overline{0\ 0}$ | 0 0 0 |

Fig.4
PRIOR ART

| PRECEDING DATA s-3 s-2 s-1 | PRESENT DATA s0 s1 s2 | NEXT DATA s3 s4 s5 | DECODED DATA b0 b1 |
|---|---|---|---|
| X 1 0 | 0 0 0 | X X X | 0 0 |
| X 0 0 | 0 0 0 | X X X | 0 1 |
| X X X | 1 0 0 | X X X | 1 1 |
| X X 0 | 0 1 0 | $\overline{0\ 0}$ X | 1 0 |
| X X 0 | 0 1 0 | 0 0 X | 1 1 |
| X X X | 1 0 1 | X X X | 1 0 |
| X 0 0 | 0 0 1 | X X X | 0 1 |
| X 1 0 | 0 0 1 | X X X | 0 0 |
| X X 1 | 0 0 1 | X X X | 0 0 |
| X X 1 | 0 1 0 | $\overline{0\ 0}$ X | 0 0 |
| X X 1 | 0 1 0 | 0 0 X | 0 1 |
| X X 1 | 0 0 0 | X X X | 0 1 |

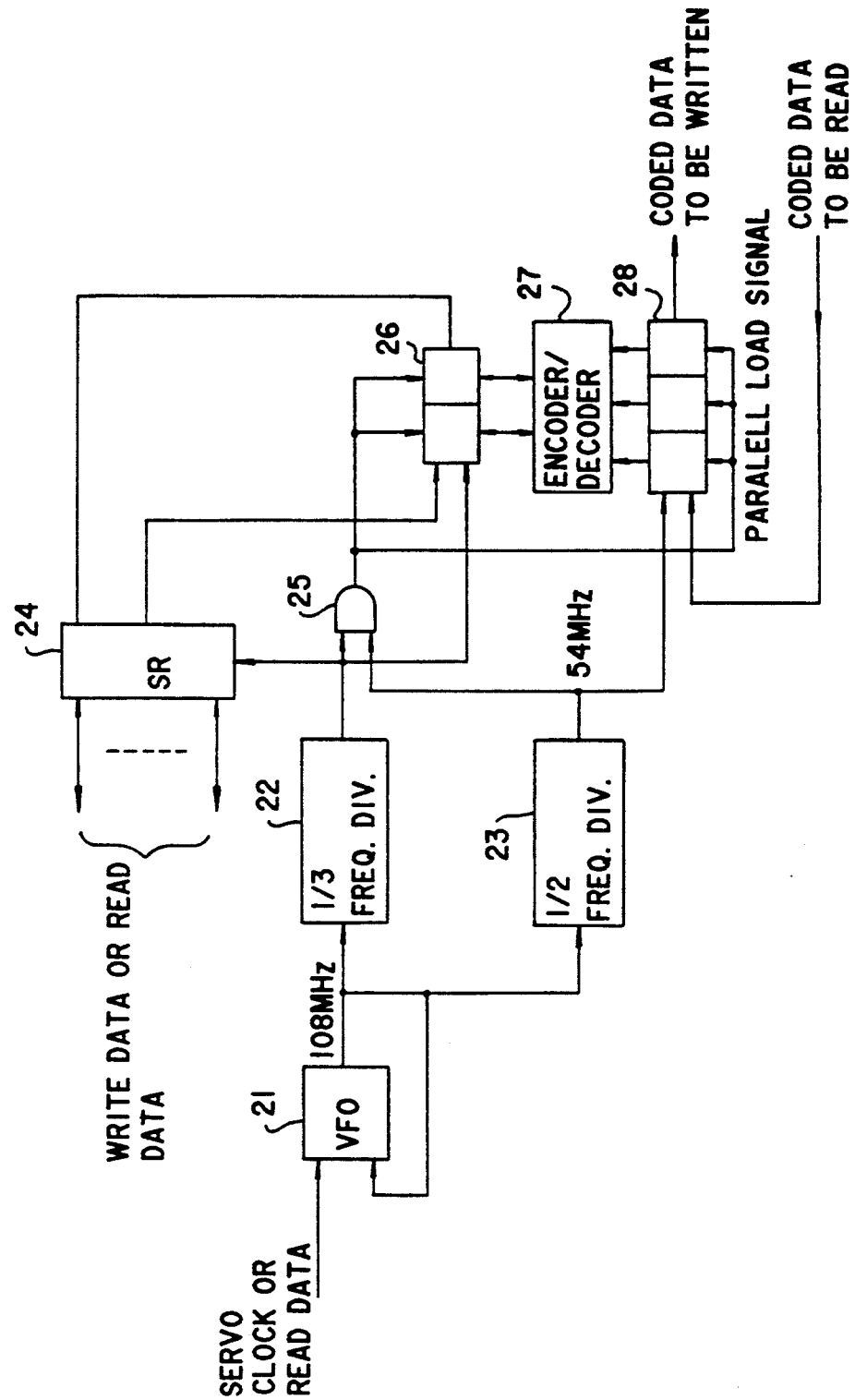

ENCODING AND DECODING CIRCUIT FOR RUN-LENGTH-LIMITED CODING

BACKGROUND OF THE INVENTION

1. Field of the Invention

The present invention relates to an encoding and/or decoding circuit for run-length-limited coding The run-length-limited coding is used, for example, for writing data at a high density on a rotating disc memory medium such as a magnetic disc medium. In the encoding operation for the run-length-limited coding, each bit sequence having a predetermined length in an original data is encoded to a code having another predetermined length before the data is written in a magnetic memory medium. One of the run-length-limited coding systems which is most frequently used in recent rotating disc devices, is called one-by-seven (1,7) coding. Various types of the (1,7) coding systems are explained in the U.S. Pat. No. 4,488,142 to P. A. Franaszek, and the U.S. Pat. No. 4,413,251 to R. L. Adler et al.

In encoding circuits for the run-length-limited coding, the above bit sequence having a predetermined length in an original data is supplied, synchronized with a clock, as an input to an encoder which converts the input to the above code having another predetermined length, and the output of the encoder is transferred, for example, to a data writing portion in a magnetic disc device, synchronized with another clock. Both the above operations for supplying of the input bit sequence and the transferring of the output, must be carried out within one cycle of the encoding operation. Since the number of the bits in the above input and output of the encoder are different, two clock signals having different frequencies must be provided for the above operations for supplying the input bit sequence and transferring the output of the encoder.

Similarly, in decoding circuits for the run-length-limited coding, bit sequence of coded data having the above other predetermined length, which is read from a data read portion in the rotating disc device, is supplied as an input to a decoder which converts the input to a bit sequence having the above predetermined length in the original data, synchronized with a clock, and the output of the decoder is transferred, for example, to a read data output portion of the rotating disc device, synchronized with another clock. Both the above operations for supplying of the input bit sequence and the transferring of the output, must be carried out within one cycle of the encoding operation. Since the number of the bits in the above input and output of the decoder are different, two clock signals having different frequencies must be provided for the above operations for supplying the input bit sequence and transferring the output of the decoder.

Further, since both the clock signals must synchronize with the above cycle of the encoding operation, both the above clock signals used for supplying the input bit sequence to the encoder or decoder and transferring the output of the encoder or decoder, are usually generated from a common clock. Conventionally, the above two clock signals are generated from a clock which is generated by a variable frequency oscillator (VFO), and therefore, the frequency of the clock is at least equal to the least common multiple of the frequencies of the two clock signals.

However, recently, high speed data transfer is required in rotating disc devices as well as other data storage devices. To realize the high speed data transfer, the frequencies of the above-mentioned two clock signals used for supplying the input bit sequence and transferring the output of the encoder or decoder, must be increased.

However, generally, the oscillation in the variable frequency oscillator is liable to become unstable when the frequency is high, and therefore, precise circuit elements must be used for constructing the variable frequency oscillator for high frequency, and additional complex circuitry is required to be provided for making the operation of the variable frequency oscillator stable, and these are factors which increase cost and power consumption. Further, when the frequency of the system clock is high, the circuitry around the variable frequency oscillator must be constructed of high speed circuit elements, which also increases cost and power consumption.

Therefore, to realize the above high-speed operation in supplying the input bit sequence to the encoder or decoder and transferring the output of the encoder or decoder, using a clock having not so high a frequency is required.

2. Description of the Related Art

FIG. 1 shows the relationships between the above-mentioned bit sequence in the original data and the corresponding coded data in the one-by-seven coding in the encoding operation, which is disclosed in the U.S. Pat. No. 4,488,142 to P. A. Franaszek and U.S. Pat. No. 4,866,544 to S. Hashimoto. As shown in FIG. 1, in the one-by-seven coding, a pair of two successive bits are converted into a code data comprised of three bits, and in the coding operation of each pair of the original data, a bit preceding the pair and a next one or two bits following the pair are used for the coding. In FIG. 1, b0 and b1 denote a pair of bits in the original data which is under the coding operation, b2 and b3 denote a next pair of bits in the original data following the bit b1, s0, s1, and s2 denote coded data corresponding to the pair of bits b0 and b1, x denotes a don't care bit (i.e., the bit is not used for the coding) $\overline{00}$ denotes any pair of bits except 00, and $\overline{01}$ denotes any pair of bits except 01.

In the prior art, a construction as shown in FIG. 2 is used for carrying out the above encoding. FIG. 2, reference numeral 1 denotes a variable frequency oscillator, 2 denotes a ½ frequency divider, 3 denotes a ⅓ frequency divider, 4, 6 and 8 each denote a shift register, 5 denotes an AND gate, and 7 denotes a coder.

In the construction of FIG. 2, the variable frequency oscillator 1 generates a system clock of 108 MHz frequency, where a servo clock or READ DATA signal is used as a reference clock. The system clock of 108 MHz is supplied to the ½ frequency divider 2 and the ⅓ frequency divider 3, and a clock of 36 MHz and another clock of 54 MHz are from the ½ frequency divider 2 and the ⅓ frequency divider 3, respectively. In addition, the clocks of 36 MHz and 54 MHz are applied to input terminals of the AND gate 5 to generate a parallel load control signal having a frequency of 18 MHz.

First, a set of the original data which is to be written in the rotating disc medium (which is denoted by WRITE DATA in FIG. 2), for example, one byte of data, is set in parallel in the shift register 4. Then, each bit of the shift register 4 is serially output from the shift register 4 to enter the shift register 6 synchronized with the above clock of 36 MHz. When a pair of bits is written in the shift register 6, the pair of bits is loaded in the coder 7 at the timing of the parallel load control signal. Corresponding to the input, the coder 7 outputs coded data comprised of three bit in accordance with the relationships shown in FIG. 1. Then, the output of the coder 7 is loaded in parallel in the shift register 8. Finally, each bit of the data loaded in the shift register 8 is serially output therefrom to be supplied to a data writing portion (not shown) in the rotating disc device synchronized with the above clock of 54 MHz.

As explained before, in the construction of FIG. 2, the system clock of 108 MHz is needed to be generated by the variable frequency oscillator 1 to generate the clocks of 36 MHz and 54 MHz for supplying the input bit sequence to the encoder 7 and transferring the output of the encoder 7. The timing of the above three clocks of 108 MHz, 54 MHz, and 36 MHz are shown in FIG. 3.

Similarly, in decoding circuits for the run-length-limited coding, a bit sequence of coded data having the above another predetermined length, which is read from a data read portion in the rotating disc device, is supplied as an input to a decoder which converts the input to a bit sequence having the above predetermined length in the original data, synchronized with a clock, and the output of the decoder is transferred to a read data output portion of the rotating disc device, synchronized with another clock. Both the above operations for supplying of the input bit sequence and the transferring of the output, must be carried out within one cycle of the encoding operation. Since the number of the bits in the above input and output of the decoder are different, two clock signals having different frequencies must be provided for the above operations for supplying the input bit sequence and transferring the output of the decoder.

FIG. 4 shows the relationships between the bit sequence of coded data comprised of three bits, which is read from a data read portion in the rotating disc device, and the corresponding bit sequence of a pair of bits in the decoded data, in the decoding operation in the one-by-seven coding, which is disclosed in the U.S. Pat. No. 4,488,142 to P. A. Franaszek. As shown in FIG. 4, in the one-by-seven coding, code data comprised of three bits are decoded into a pair of two successive bits, and in the decoding operation of each pair of the original data, a bit preceding the pair and a next one or two bits following the pair are used for the coding. In FIG. 4, s0, s1, and s2 denote coded data which is under the decoding operation, s3, s4, and s5 denote coded data which follows the three bits s0, s1, and s2, s-1, s-2, and s-3 which precedes the three bits s0, s1, and s2, b0 and b1 denote a pair of bits in the decoded data corresponding to the three bits s0, s1 and s2, x denotes a don't care bit, and $\overline{00}$ denotes any pair of bits except 00.

In the prior art, a construction as shown in FIG. 5 is used for carrying out the above decoding. In FIG. 5, reference numeral 11 denotes a variable frequency oscillator, 12 denotes a ⅓ frequency divider, 13 denotes a ½ frequency divider, 14 denotes an AND gate, 15 and 17 each denote a shift register, and 16 denotes a decoder.

In the construction of FIG. 5, the construction for generating clocks comprised of the variable frequency oscillator 11 for generating a system clock of 108 MHz frequency, the ⅓ frequency divider 2 for generating a clock of 36 MHz, the ½ frequency divider 3 for generating a clock of 54 MHz, and the AND gate 14, are the same as the corresponding construction in FIG. 2.

In the construction of FIG. 5, first, a set of the coded data which has been read from a rotating disc medium in the rotating disc device (which is denoted by READ DATA in FIG. 5), comprised of three bits, is serially entered in the shift register 17 synchronized with the clock of 54 MHz. When each bit sequence comprised of three bits is set in the shift register 17, the content of the shift register 17 is loaded in parallel in the decoder 16 at the timing of the parallel load control signal of 18 MHz. Corresponding to the input, the decoder 16 outputs decoded data comprised of a pair of bits in accordance with the relationships shown in FIG. 4. Then, the output of the decoder 16 is loaded in parallel in the shift register 15. Finally, each bit of the data loaded in the shift register 15 is serially output therefrom to be supplied to a data reading portion (not shown) in the rotating disc device synchronized with the above clock of 36 MHz.

As explained before, in the construction of FIG. 5, the system clock of 108 MHz is needed to be generated in the variable frequency oscillator 1 to generate the clocks of 36 MHz and 54 MHz for supplying the input bit sequence to the decoder 16 and transferring the output of the decoder 16.

Further, FIG. 6 shows the construction of an encoder/decoder which operates as an encoder when writing data in the rotating disc medium, and operates as a decoder when reading data from the rotating disc medium. As readily understood from the construction of FIG. 6, the construction of FIG. 6 includes both the constructions of FIGS. 2 and 5, and the constructions included in FIG. 6 respectively operate in the same manner as the constructions of FIGS. 2 and 5.

To solve the above-mentioned problem, some attempts have been made as follows.

The Japanese Unexamined Patent Publication No. 63-144464 discloses a technique wherein first and second variable frequency oscillators, a ⅓ frequency divider, and a ½ frequency divider are provided. The first variable frequency oscillator generates a clock having a frequency of 54 MHz using the servo clock or the read data signal as a reference clock, and the clock is frequency-divided in the ⅓ frequency divider to obtain a clock having a frequency of 18 MHz. The second frequency divider generates another clock having a frequency of 36 MHz. The frequency of the output clock of the second frequency divider is divided by the ½ frequency divider to obtain a clock having a frequency of 18 MHz, and the second frequency divider maintains the frequency of 36 MHz by comparing the output clock of the ½ frequency divider with the output clock of ⅓ frequency divider as a reference clock.

However, in the above technique, two variable frequency oscillators are necessary, and the cost is increased.

The Japanese Unexamined Patent Publication No. 61-250875 discloses a technique wherein a ⅔ frequency divider is constructed as an analog circuit, and the ⅔ frequency divider generates a clock having a frequency of 36 MHz from a clock having a frequency of 54 MHz which is generated by a variable frequency oscillator using the servo clock or the read data signal as a reference clock.

However, in the above technique, an analog circuit must be used for constructing the ⅔ frequency divider, and therefore, a troublesome adjustment is required for the analog circuit, the construction as an LSI is difficult, and the cost for constructing the circuit is increased.

The Japanese Unexamined Patent Publication No. 63-144465 discloses a technique wherein a clock "substantially" having a frequency of 36 MHz is generated by removing one pulse in every successive three pulses in a clock having a frequency of 54 MHz.

However, in the above technique, the intervals of successive two pulses in the clock "substantially" having a frequency of 36 MHz are the same as the intervals of corresponding two pulses in the clock having a frequency of 54 MHz. That is, microscopically, the actual maximum frequency in which the successive pulses in the above clock "substantially" having a frequency of 36 MHz appear, is equal to 54 MHz. Therefore, the construction of a portion of the circuitry which operates synchronized with the above clock "substantially" having a frequency of 36 MHz, must be designed so that the portion can operate synchronized with the above successive pulses appearing at 54 MHz in the clock "substantially" having a frequency of 36 MHz. That is, the portion of the circuitry must be constructed by circuit elements designed for operating in a relatively higher speed, and this increases power consumption in that portion and the cost for constructing that portion.

SUMMARY OF THE INVENTION

An object of the present invention is to provide an encoder and/or decoding circuit wherein a high transfer speed is realized in inputting data to be encoded/decoded and outputting encoded/decoded data using a variable frequency oscillator generating a system clock having a low frequency, which can be constructed at a low cost, and which is stable without complex circuitry.

According to the first aspect of the present invention, there is provided an encoding circuit for converting successive bits of original data to successive bits of coded data at a coding rate equal to m/n in accordance with a rule of a run-length-limited coding system (where m and n are each an integer satisfying $m<n$) comprising a first clock generating circuit, a frequency dividing circuit, an encoder, r shift registers, and a serial output circuit. The first clock generating circuit generates a first clock. The frequency dividing circuit divides a frequency of the first clock by nr/m to generate a second clock, where r is an integer, which is equal to or is a divisor of the integer m. The encoder inputs successive m bits in the successive bits of the original data in its one encoding cycle, and outputs successive n bits of coded data corresponding to the input of the m bits of the original data in its one encoding cycle. The r shift registers each inputs every r-th bit of the successive bits of the original data so that each of the successive bits of the original data are input to one of the r shift registers without being doubly input into more than one registers. The serial output circuit receives in parallel the successive n bits which are output from the encoder, and serially outputs the successive n bits synchronizing with the first clock. The r shift registers simultaneously output a respective one of the bits held therein, to the encoder, synchronizing with the second clock, where the bits which are simultaneously output from the r shift registers are m/r of the successive m bits in the original data for its one encoding cycle.

According to the second aspect of the present invention, there is provided a decoding circuit for converting successive bits of coded data to successive bits of original data at a coding rate equal to m/n in accordance with a rule of a run-length-limited coding system (where m and n are each an integer satisfying $m<n$) comprising a first clock generating circuit, a frequency dividing circuit, a decoder, r shift registers, and a serial input circuit. The first clock generating circuit generates a first clock. The frequency dividing circuit divides a frequency of the first clock by nr/m to generate a second clock, where r is an integer, which is equal to or is a divisor of the integer m. The decoder inputs successive n bits in the successive bits of the coded data in its one decoding cycle, and outputs successive m bits of the original data corresponding to the input of the n bits of the coded data in its one decoding cycle. The r shift registers each serially inputs every r-th bit of the successive bits of the output of the decoder synchronizing with the second clock, so that each of the successive bits of the output of the decoder are input to one of the r shift registers without being doubly input into more than one shift registers. The serial input circuit serially inputs the successive bits of the coded data which are to be decoded in the decoder synchronizing with the first clock, and supplies the successive n bits to the decoder for the one decoding cycle.

According to the third aspect of the present invention, there is provided an encoding and decoding circuit for converting successive bits of original data to successive bits of coded data at a coding rate equal to m/n in accordance with a rule of a run-length-limited coding system, and converting successive bits of coded data to successive bits of original data at a coding rate equal to m/n in accordance with the rule of the run-length-limited coding system, where m and n are each an integer satisfying $m<n$, comprising a first clock generating circuit, a frequency dividing circuit, an encoder, r shift registers, and a serial output/input circuit. The first clock generating circuit generates a first clock. The frequency dividing circuit divides a frequency of the first clock by nr/m to generate a second clock, where r is an integer, which is equal to or is a divisor of the integer m. The encoder inputs successive m bits in the successive bits of the original data in its one encoding cycle, and outputs successive n bits of coded data corresponding to the input of the m bits of the original data in its one encoding cycle. The decoder inputs successive n bits in the successive bits of the coded data in its one decoding cycle, and outputs successive m bits of the original data corresponding to the input of the n bits of the coded data in its one decoding cycle. The shift registers each inputs every r-th bit of the successive bits of the original data so that each of the successive bits of the original data are input to one of the r shift registers without being doubly input into more than one shift register when encoding the original data, and the r shift registers each serially inputs every r-th bit of the successive bits of the output of the decoder synchronizing with the second clock, so that each of the successive bits of the output of the decoder are input to one of the r shift registers without being doubly input into more than one shift register when decoding the coded data. The serial output/input circuit receives in parallel the successive n bits which are output from the encoder, and serially outputs the successive n bits synchronizing with the first clock, in the encoding operation, and serially inputs the successive bits of the coded data which are to be decoded in the decoder synchronizing with the first clock, and supplies the successive n bits to the decoder for the one decoding cycle, in the decoding operation. The r shift registers simultaneously output a respective one of the bits held therein, to the encoder, synchronizing with the second clock, where the bits which are simultaneously output from the r shift registers are m/r of the successive m bits in the original data for its one encoding cycle in the encoding operation.

BRIEF DESCRIPTION OF THE DRAWINGS

In the drawings:

FIG. 1 shows the relationships between the sequence in the original data and the corresponding coded data in the one-by-seven coding in the encoding operation;

FIG. 4 shows the relationships between the bit sequence of coded data comprised of three bits, which is read from a data read portion in the rotating disc device, and the corresponding bit sequence of a pair of bits in the decoded data, in the decoding operation in the one-by-seven coding;

FIG. 6 shows a construction for carrying out the encoding and decoding operations of FIGS. 1 and 4;

DESCRIPTION OF THE PREFERRED EMBODIMENTS

1. Basic Principle

According to the first aspect of the present invention, successive bits of data which are to be encoded are cyclically divided into a plurality of groups, and the data in the plurality of groups are input in a plurality of shift registers, respectively. Each of the plurality of shift registers simultaneously supplies a part of the m bits of the input to the encoder, synchronizing with the second clock. The above n bits of the output of the encoder is received in parallel in another shift register, and are serially output from the shift register, synchronizing with the first clock.

Since the m bits of the input to the encoder are supplied from the plurality of shift registers in parallel, the frequency of the clock controlling the operation for supplying the input to the encoder, may be lowered due to the plurality. In addition, since the circuitry in the input side of the encoder can be operated at a low frequency, the cost for constructing the circuitry and the power consumption in operating the construction can be reduced.

According to the second aspect of the present invention, successive bits of coded data which are to be decoded are serially input into a serial input circuit synchronizing with the first clock, and the n bits of the input to the decoder are supplied in parallel from the serial input circuit to the decoder. The m bits of the output of the decoder are cyclically divided into a plurality (r) of shift registers synchronizing with the second clock, and the original data is obtained in parallel from the plurality of shift registers.

Since the m bits of the input to the encoder are supplied from the plurality of shift registers in parallel, the frequency of the clock controlling the operation for supplying the input to the encoder, may be lowered due to the plurality. In addition, since the circuitry in the output side of the decoder can be operated with a low frequency, the cost for constructing the circuitry and the power consumption in operating the construction can be reduced.

Further, both the provisions of the first and second aspects of the present invention are included in the third aspect of the present invention.

Thus, a high transfer speed is realized in inputting data to be encoded/decoded and outputting encoded/decoded data using a variable frequency oscillator generating a system clock having a low frequency, and therefore, circuitry including the variable frequency oscillator, can be constructed with a low cost, can be operated with a small power consumption, and is stable without complex construction.

2. First Embodiment

Figure 2:
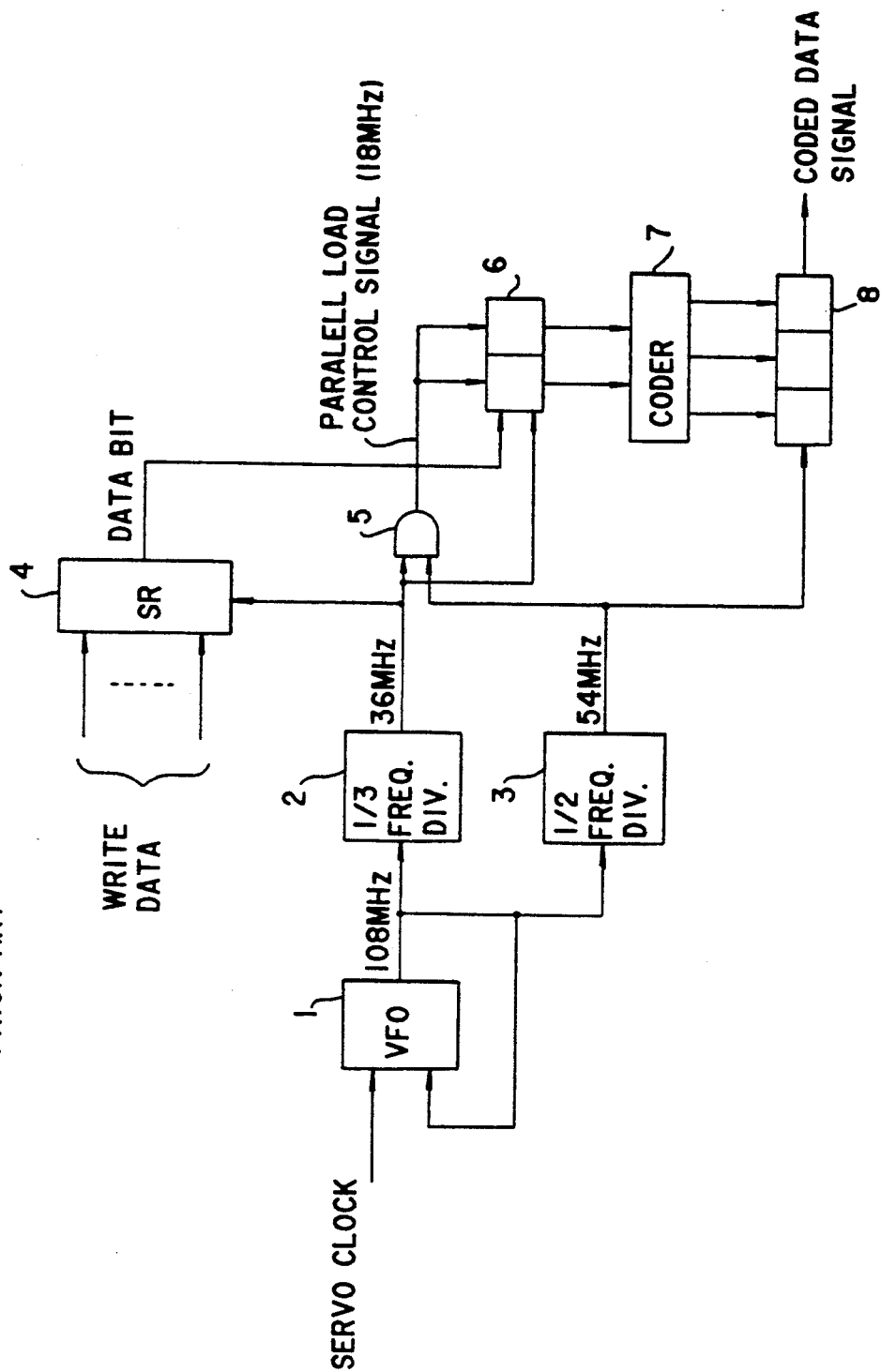
FIG. 2 shows a construction for carrying out the encoding operation of FIG. 1.
Figure 3:
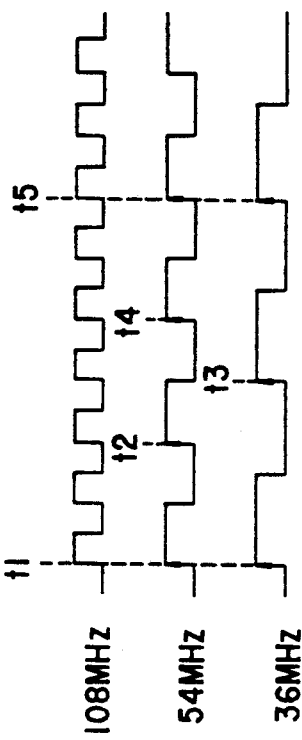
FIG. 3 shows the timing of the three clocks of 108 MHz, 54 MHz, and 36 MHz used in the construction of FIG. 2.
Figure 5:
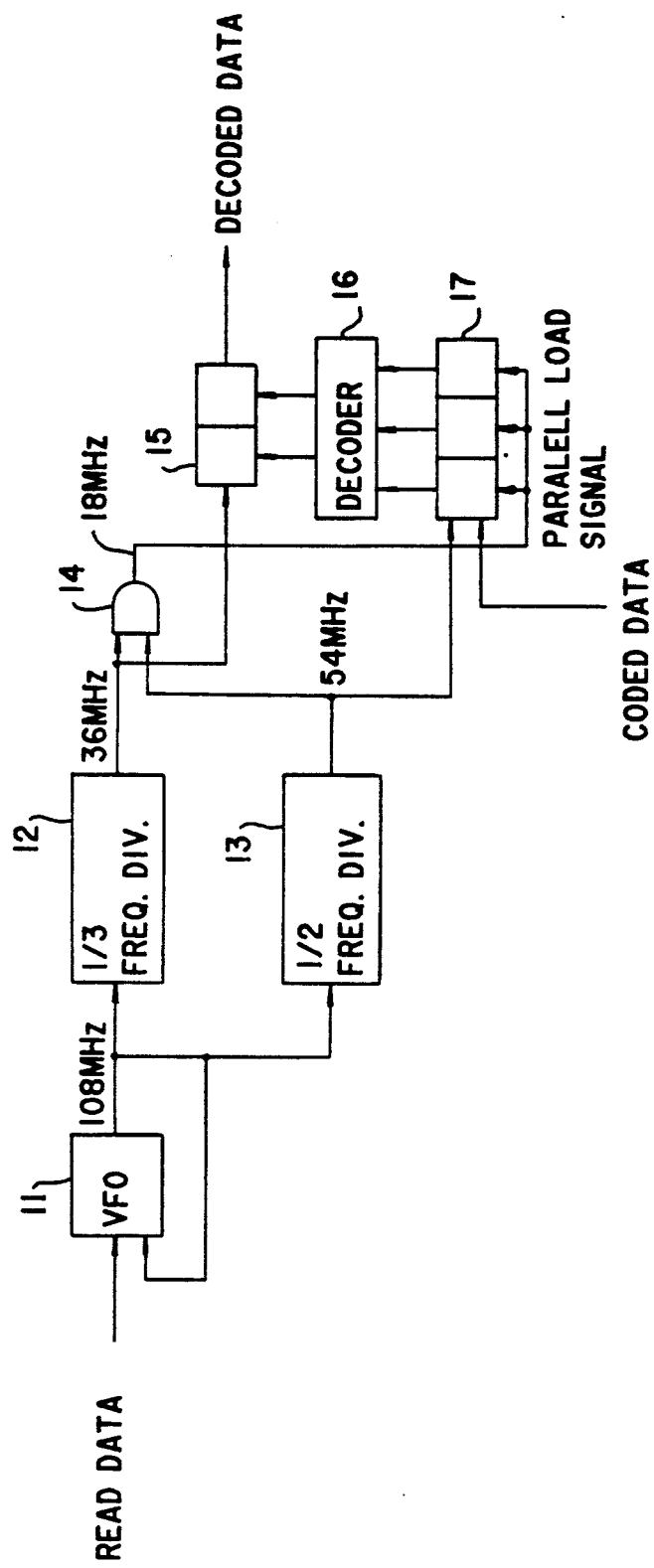
FIG. 5 shows a construction for carrying out the decoding operation of FIG. 4.
Figure 7:
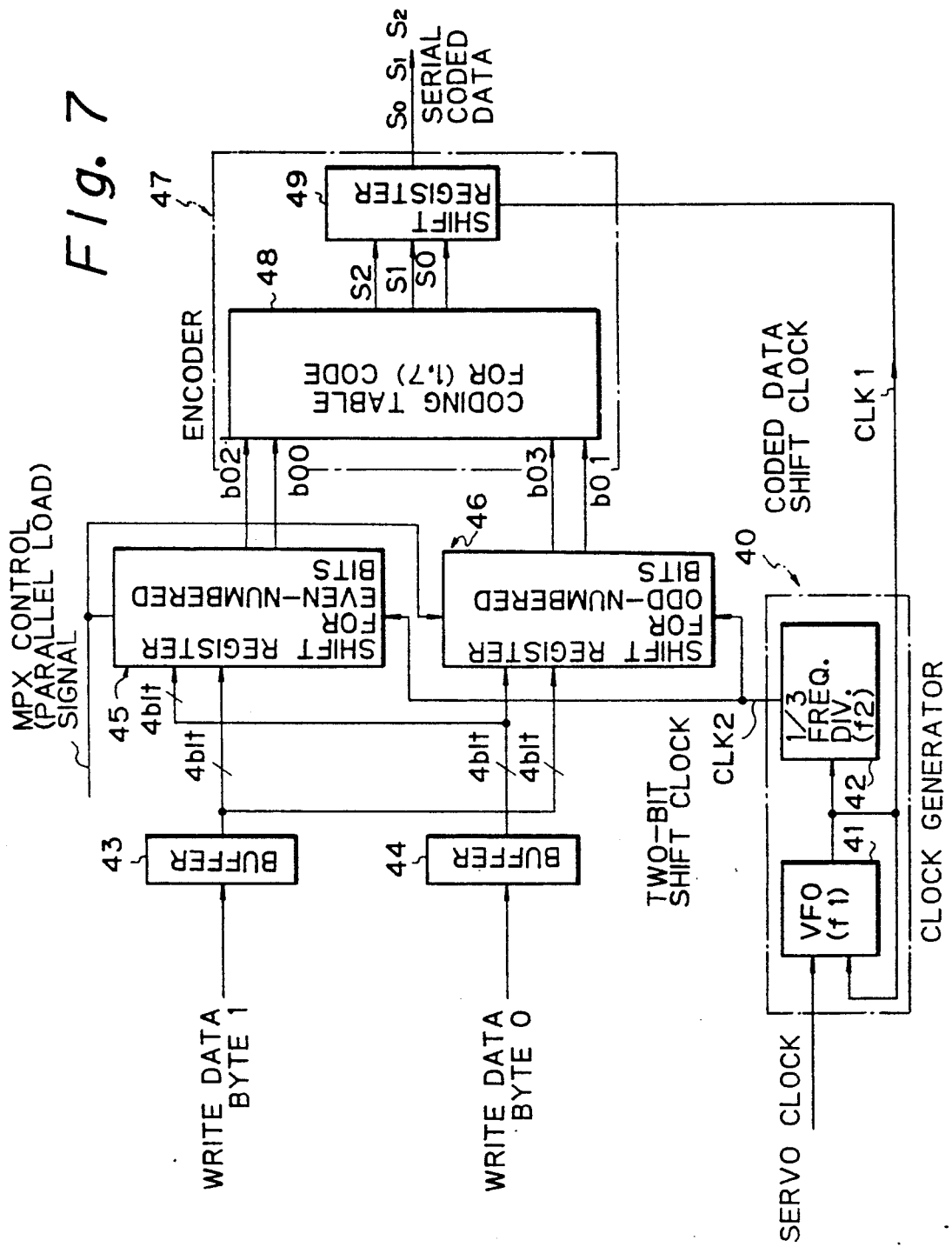
FIG. 7 shows the construction of the encoding circuit which is used for the first and second embodiments of the present invention.

FIG. 7 shows the construction of an encoding circuit which is used for the first and second embodiments of the present invention. In FIG. 7, reference numeral 40 denotes a clock generator, 41 denotes a variable frequency oscillator, 42 denotes a ½ frequency divider, 43 and 44 each denote a data buffer, 45 and 46 each denote a shift register, 47 denotes an encoder, 48 denotes a coding table, and 49 denotes a shift register.

Figure 8:
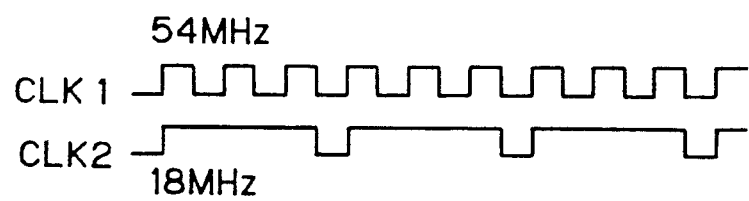
FIG. 8 shows timing of the clock signals CLK1 and CLK2 of 54 MHz and 18 MHz which are generated in the clock generator 40 in FIG. 7.

The variable frequency oscillator 41 generates a coded data shift clock CLK1 having a frequency of 54 MHz, and the ½ frequency divider generates a two-bit shift clock CLK2 having a frequency of 18 MHz by dividing the frequency of the coded data shift clock CLK1. FIG. 8 shows timing of the clock signals CLK1 and CLK2 of 54 MHZ and 18 MHz which are generated in the clock generator 40 in FIG. 7.

Figure 9:
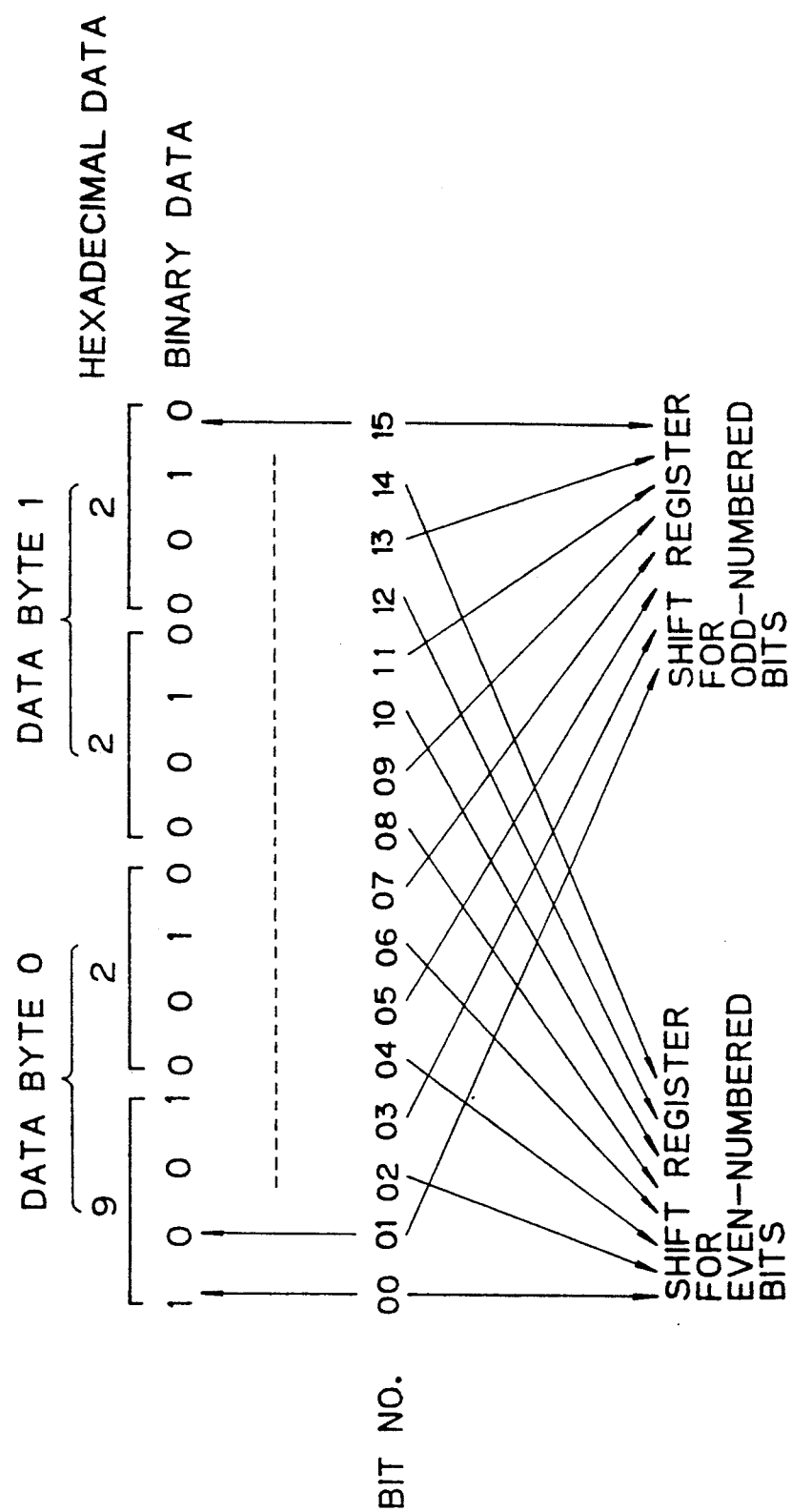
FIG. 9 shows the connection between the output bits of the buffer registers 43 and 44 and the input bits of the shift registers 45 and 46 in the construction of FIG. 7.

Each of even-numbered bytes of data which is to be written in the rotating disc medium is held in the data buffer 44, and each of odd-numbered bytes of data which is to be written in the rotating disc medium is held in the data buffer 43. The outputs of the data buffers 43 and 44 are applied to the shift registers 45 and 46. The shift registers 45 and 46 each contains eight bits. The connection between the output bits of the buffer registers 43 and 44 and the input bits of the shift registers 45 and 46 in the construction of FIG. 7, are shown in FIG. 9. In FIG. 9, the output bits of the buffer register 43 are numbered as 15 to 08 from the most significant bit to the least significant bit, and the output bits of the buffer register 44 are numbered as 07 to 00 from the most significant bit to the least significant bit. As shown in FIG. 9, all the even-numbered bits of data which is held in the data buffers 43 and 44 are applied to the shift register 45, and all the odd-numbered bits of data which is held in the data buffers 43 and 44 are applied to the shift register 46.

The data bits which are applied to the shift registers 45 and 46, are loaded in parallel in the shift registers 45 and 46 at the timing of the multiplexer control signal (parallel load signal). The multiplexer control signal (parallel load signal) has a frequency of 2.25 MHz (⅛ of 18 MHz). The content of each bit of the shift registers 45 and 46 is shifted by one bit in the direction from the most significant bit to the least significant bit, synchronized with the above two-bit shift clock CLK2 of 18 MHz. The respective least significant bits in both the shift registers 45 and 46, which are respectively denoted by b00 and b01, and the respective second bits from the least significant bits in both the shift registers 45 and 46, which are respectively denoted by b02 and b03, are applied to the coding table 48. The coding table 48 is constructed by a hardware logic circuit, and the above output bits from the shift registers 45 and 46 are applied as an input of the hardware logic circuit. The hardware logic circuit 48 outputs coded data s0, s1, and s3 corresponding to the input bits b00, b01, b02, and b03 in accordance with the relationships of FIG. 1, where the above bits b00, b01, b02, and b03 respectively correspond to the bits b0, b1, b2, and b3 in FIG. 1. The coding table which carries out the conversion in accordance with the relationships of FIG. 1, is explained in the U.S. Pat. No. 4,488,142 to P. A. Franaszek and U.S. Pat. No. 4,866,544 to S. Hashimoto. The description of the coding tables in U.S. Pat. No. 4,866,544 to S. Hashimoto is hereby incorporated by reference herein.

The output comprised of the bits s0, s1, and s3 of the coding table 48 is loaded in parallel in the shift register 49, where the shift register 49 contains three bits. The content of the shift register 49 is serially output therefrom synchronized with the coded data shift clock CLK1 of 54 MHz, which is also denoted as a coded data shift clock in FIG. 7.

Figure 10:
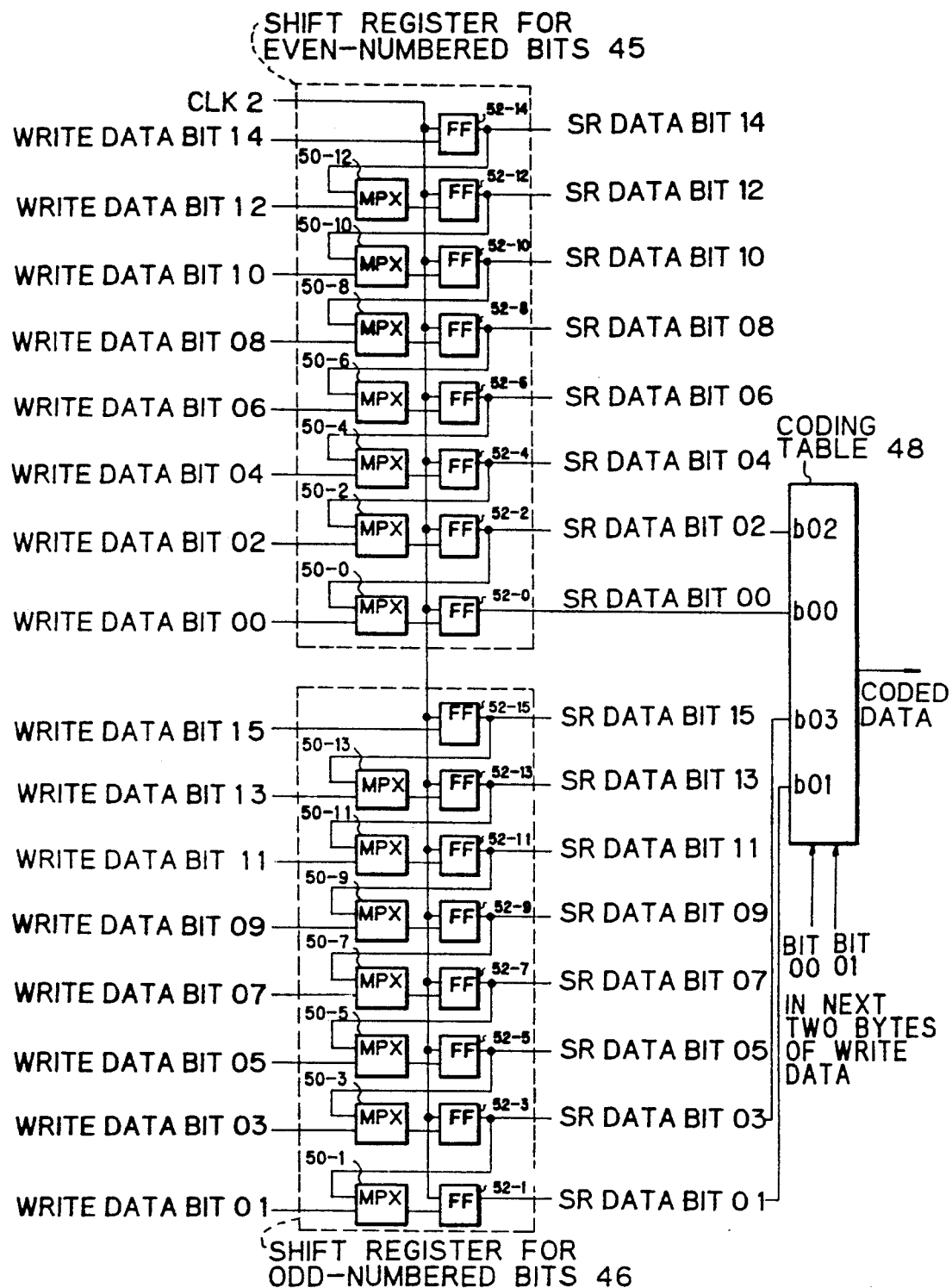
FIG. 10 shows the construction of the shift registers 45 and 46 of FIG. 7 which are used in the first embodiment of the encoding circuit according to the present invention.

FIG. 10 shows the construction of the shift registers 45 and 46 of FIG. 7 which are used in the first embodiment of the encoding circuit according to the present invention. In FIG. 10, reference numeral 50-0, 50-1, 50-2, 50-3, 50-4, 50-5, 50-6, 50-7, 50-8, 50-9, 50-10, 50-11, 50-12, and 50-13 each denote a multiplexer, 52-0, 52-1, 52-2, 52-3, 52-4, 52-5, 52-6, 52-7, 52-8, 52-9, 52-10, 52-11, 52-12, 52-13, 52-14, and 52-15 each denote a flip-flop circuit, and the coding table 48 is the coding table of FIG. 7.

The shift register 45 comprises the multiplexers 50-0, 50-2, 50-4, 50-6, 50-8, 50-10, and 50-12, and the flip-flop circuits 52-0, 52-2, 52-4, 52-6, 52-8, 52-10, 52-12, and 52-14, and the shift register 46 comprises the multiplexers 50-1, 50-3, 50-5, 50-7, 50-9, 50-11, and 50-13, and the flip-flop circuits 52-1, 52-3, 52-5, 52-7, 52-9, 52-11, 52-13, and 52-15. All the flip-flop circuits 52-0, 52-1, 52-2, 52-3, 52-4, 52-5, 52-6, 52-7, 52-8, 52-9, 52-10, 52-11, 52-12, 52-13, 52-14, and 52-15 receives the above-mentioned two-bit shift clock CLK2 at their edge-triggered input terminals.

The flip-flop circuit 52 14 receives the output of the bit of No. 14 from the data buffer 43. The multiplexer 50-12 receives the output of the flip-flop circuit 52-14 and the output of the bit of No. 12 from the data buffer 43, and its output is applied to the flip-flop circuit 52-12. The multiplexer 50-10 receives the output of the flip-flop circuit 52 12 and the output of the bit of No. 10 from the data buffer 43, and its output is applied to the flip-flop circuit 52-10. The multiplexer 50-8 receives the output of the flip-flop circuit 52-6 and the output of the bit of No. 08 from the data buffer 43, and its output is applied to the flip-flop circuit 52-8. The multiplexer 50-6 receives the output of the flip-flop circuit 52-8 and the output of the bit of No. 06 from the data buffer 44, and its output is applied to the flip-flop circuit 52-6. The multiplexer 50-4 receives the output of the flip-flop circuit 52-6 and the output of the bit of No. 04 from the data buffer 44, and its output is applied to the flip-flop circuit 52-4. The multiplexer 50-2 receives the output of the flip-flop circuit 52-4 and the output of the bit of No. 02 from the data buffer 44, and its output is applied to the flip-flop circuit 52-2. The multiplexer 50-0 receives the output of the flip-flop circuit 5- 2 and the output of the bit of No. 00 from the data buffer 44, and its output is applied to the flip-flop circuit 52-0.

Similarly, the flip-flop circuit 52-15 receives the output of the bit of No. 15 from the data buffer 43. The multiplexer 50-13 receives the output of the flip-flop circuit 52-15 and the output of the bit of No. 13 from the data buffer 43, and its output is applied to the flip-flop circuit 52-13. The multiplexer 50-11 receives the output of the flip-flop circuit 52-13 and the output of the bit of No. 11 from the data buffer 43, and its output is applied to the flip-flop circuit 52-11. The multiplexer 50-9 receives the output of the flip-flop circuit 52 11 and the output of the bit of No. 09 from, the data buffer 43, and its output is applied to the flip-flop circuit 52-9. The multiplexer 50-7 receives the output of the flip-flop circuit 52-9 and the output of the bit of No. 07 from the data buffer 44, and its output is applied to the flip-flop circuit 52-7. The multiplexer 50-5 receives the output of the flip-flop circuit 52-7 and the output of the bit of No. 05 from the data buffer 44, and its output is applied to the flip-flop circuit 52-5. The multiplexer 50-3 receives the output of the flip-flop circuit 52-5 and the output of the bit of No. 03 from the data buffer 44, and its output is applied to the flip-flop circuit 52-3. The multiplexer 50-1 receives the output of the flip-flop circuit 52-3 and the output of the bit of No. 01 from the data buffer 44, and its output is applied to the flip-flop circuit 52-1.

The aforementioned multiplexer control signal (parallel load signal) of 2.25 MHz is applied to the multiplexers 50-0, 50-1, 50-2, 50-3, 50-4, 50-5, 50-6, 50-7, 50-8, 50-9, 50-10, 50-11, 50-12, and 50-13 as their control inputs. When the multiplexer control signal (parallel load signal) is active, all the multiplexers select their inputs from the data buffers 43 and 44 as their outputs to load the outputs of the data buffers 43 and 44 in parallel in the flip-flop circuits 52-0, 52-1, 52-2, 52-3, 52-4, 52-5, 52-6, 52-7, 52-8, 52-9, 52-10, 52-11, 52-12, 52-13, 52-14, and 52-15.

When the multiplexer control signal (parallel load signal) is inactive, all the multiplexers select their inputs from the flip-flop circuits being connected thereto as their outputs so that all the flip-flop circuits 52-0, 52-2, 52-4, 52-6, 52-8, 52-10, 52-12, and 52-14 in the shift register 45 are serially connected, and all the flip-flop circuits 52-1, 52-3, 52-5, 52-7, 52-9, 52-11, 52-13, and 52-15 in the shift register 46 are serially connected. In the inactive state of the multiplexer control signal (parallel load signal), the content of each flip-flop circuit is shifted by one bit in the direction from the flip-flop circuit 52-14 to flip-flop circuit 52-0 in the shift register 45, and in the direction from the flip-flop circuit 52-15 to flip-flop circuit 52-1 in the shift register 46, when receiving a rising edge of the two-bit shift clock CLK2 of 18 MHz.

The outputs of the flip-flop circuits 52-0 to 52-3, which are the aforementioned bits b00 to b03, are applied to the coding table 48. Further, in the first embodiment of the present invention, the coding table 48 receives bits b00 and b01 in the next one byte data which is to be written in the rotating disc medium for use in encoding the last pair of bits in the data buffers 43 and 44 respective least significant bits in both the shift registers 45 and 46.

Figure 11:
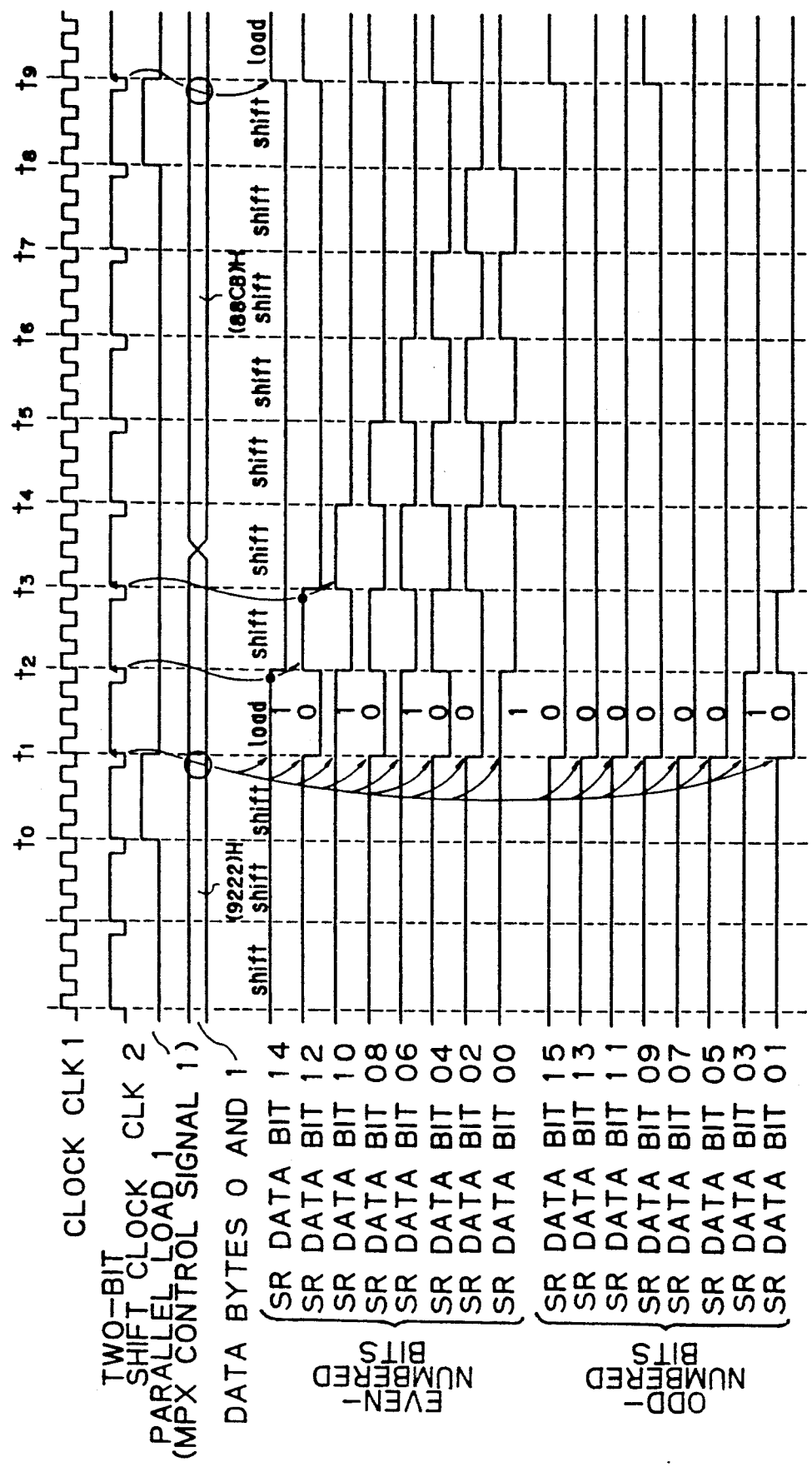
FIG. 11 shows the timing of the first embodiment of the encoding circuit according to the present invention.

FIG. 11 shows the timing of the first embodiment of the encoding circuit shown FIGS. 7 and 10. In the example shown in FIG. 11, the data which is expressed by the sixteen bits which are first held in the data buffers 43 and 44, is "9222" in hexadecimal notation. That is, "1010100100000010" in binary notation is first held in the data buffers 43 and 44. The multiplexers 50-0, 50-1, 50-2, 50-3, 50-4, 50-5, 50-6, 50-7, 50-8, 50-9, 50-10, 50-11, 50-12, and 50-13 in the shift registers 45 and 46 respectively select their inputs from the data buffers 43 and 44 when the above-mentioned multiplexer control signal (parallel load signal) becomes active at the time t0. The multiplexer control signal (parallel load signal) is denoted by PARALLEL LOAD 1 (MPX CONTROL SIGNAL 1) to distinguish this signal from another multiplexer control signal (parallel load signal) which is denoted by PARALLEL LOAD 2 (MPX CONTROL SIGNAL 2) in the second embodiment. Thus, each output bit of the data buffers 43 and 44 is entered in the corresponding flip-flop circuit through the corresponding multiplexer in the shift registers 45 and 46 (i.e., the data held in the data buffers 43 and 44 is loaded in parallel in the shift registers 45 and 46 at the time t1). From the time t2 to t9, the content of each flip-flop circuit is shifted by one bit in the direction from the No. 14 bit to the No. 00 bit in the shift register 45, and the content of each flip-flop circuit is shifted by one bit in the direction from the No. 15 bit to the No. 01 bit in the shift register 46 every time the two-bit shift clock CLK2 rises.

Thus, from the time t2 to t8, the bit of No. 2i (i=0 to 6) held in the data buffers 43 or 44, is applied to the input port b00 of the coding table 48, after being shifted through the flip-flop circuits 52-2i to 52-0. At the same time, the next bit of No. 2(i+1) is applied to the input port b02 of the coding table 48 after being shifted through the flip-flop circuits 52-2(i+1) to 52-2. The bit of No. 2i+1 (i=0 to 6) held in the data buffers 43 and 44, is applied to the input port b01 of the coding table 48, after being shifted through the flip-flop circuits 52-2i+1 to 52-1. At the same time, the next bit of No. 2(i+1)+1 is applied to the input port b03 of the coding table 48 after being shifted through the flip-flop circuits 52 2(i+1)+1 to 52-3. From the time t8 to t9, the bit of No. 14 held in the data buffers 43 and 44, is applied to the input port b00 of the coding table 48, after being shifted through the flip-flop circuits 52-14 to 52-0, and the bit of No. 15 held in the data buffers 43 and 44, is applied to the input port b01. of the coding table 48, after being shifted through the flip-flop circuits 52-15 to 52-1. As mentioned before, for decoding the above last pair of bits of Nos. 14 and 15, the bits of Nos. 00 and 01 in the next two data bytes which are to be written in the rotating disc medium, are also supplied to the coding table 48.

As shown in FIG. 11, the next two byte-data "88CB" in hexadecimal notation is held in the data buffers 43 and 44 between the times t3 and t4. The multiplexers 50-0, 50-1, 50-2, 50-3, 50-4, 50-5, 50-6, 50-7, 50-8, 50-9, 50-10, 50-11, 50-12, and 50-13 in the shift registers 45 and 46 respectively select their inputs from the data buffers 43 and 44 again when the above-mentioned multiplexer control signal 1 (parallel load signal 1) becomes active at the time t8. Thus, each output bit of the data buffers 43 and 44 is entered in the corresponding flip-flop circuit through the corresponding multiplexer in the shift registers 45 and 46 (i.e., the data held in the data buffers 43 and 44 is loaded in parallel in the shift registers 45 and 46 at the time t9).

3. Second Embodiment

Figure 12:
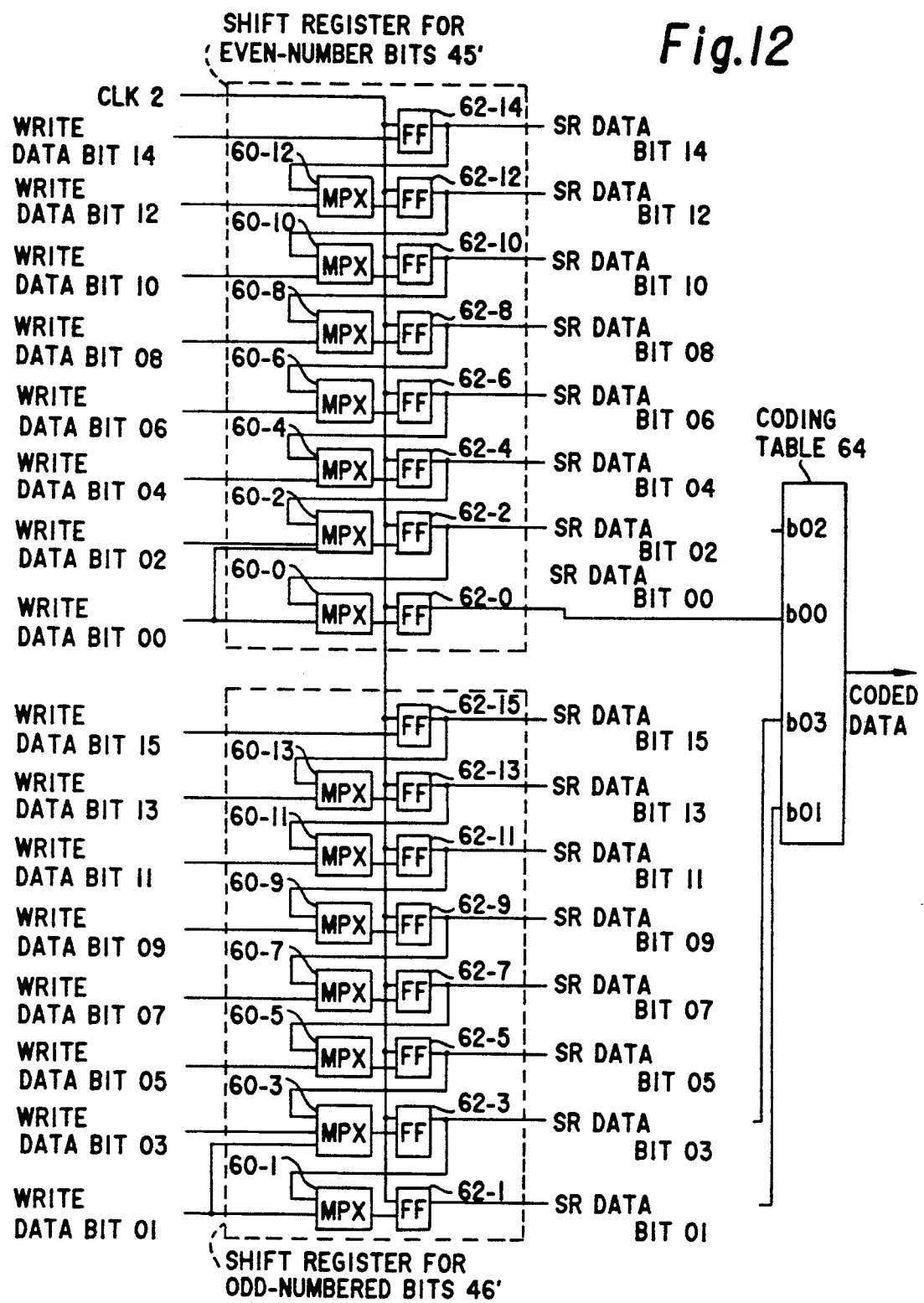
FIG. 12 shows the construction of the shift registers 45 and 46 of FIG. 7 which are used in the second embodiment of the encoding circuit according to the present invention.

FIG. 12 shows the construction of the shift registers 45 and 46 of FIG. 7 which are used in the second embodiment of the encoding circuit according to the present invention. Since the constructions of the shift registers in FIG. 12 are different from the constructions of the shift registers of FIG. 10, different reference numerals 45' and 46' are used for the shift registers in FIG. 12. The constructions shown in FIG. 10 and 12 are the same except explained below. In the construction of FIG. 12, no additional input port is provided in the coding table 48 for receiving the first and second bits in the next byte data, and in the shift registers 45' and 46', the multiplexers 60-2 and 60-3 the outputs of which are respectively applied to the flip-flop circuits 62-2 and 62-3, are each a multiplexer receiving three inputs, where two of the three inputs are the same as the aforementioned two inputs of the multiplexers 50-2 and 50-3 in the construction of FIG. 10, the bit of No. 00 is applied as the other input of the multiplexer 60-2, and the bit of No. 01 is applied as the other input of the multiplexer 60-3. The multiplexers 60-2 and 60-3 are respectively controlled to select the inputs of the bits of Nos. 02 and 03 from the data buffers 43 and 44 when receiving an active multiplexer control signal 1 (parallel load signal 1), and are respectively controlled to select the inputs of the bits of Nos. 00 and 01 from the data buffers 43 and 44 when receiving an active multiplexer control signal 2 (parallel load signal 2). The multiplexer control signal 2 (parallel load signal 2) is also a periodic signal having a frequency of 2.25 MHz, and becomes active one cycle before the multiplexer control signal 1 (parallel load signal 1) becomes active.

Figure 13:
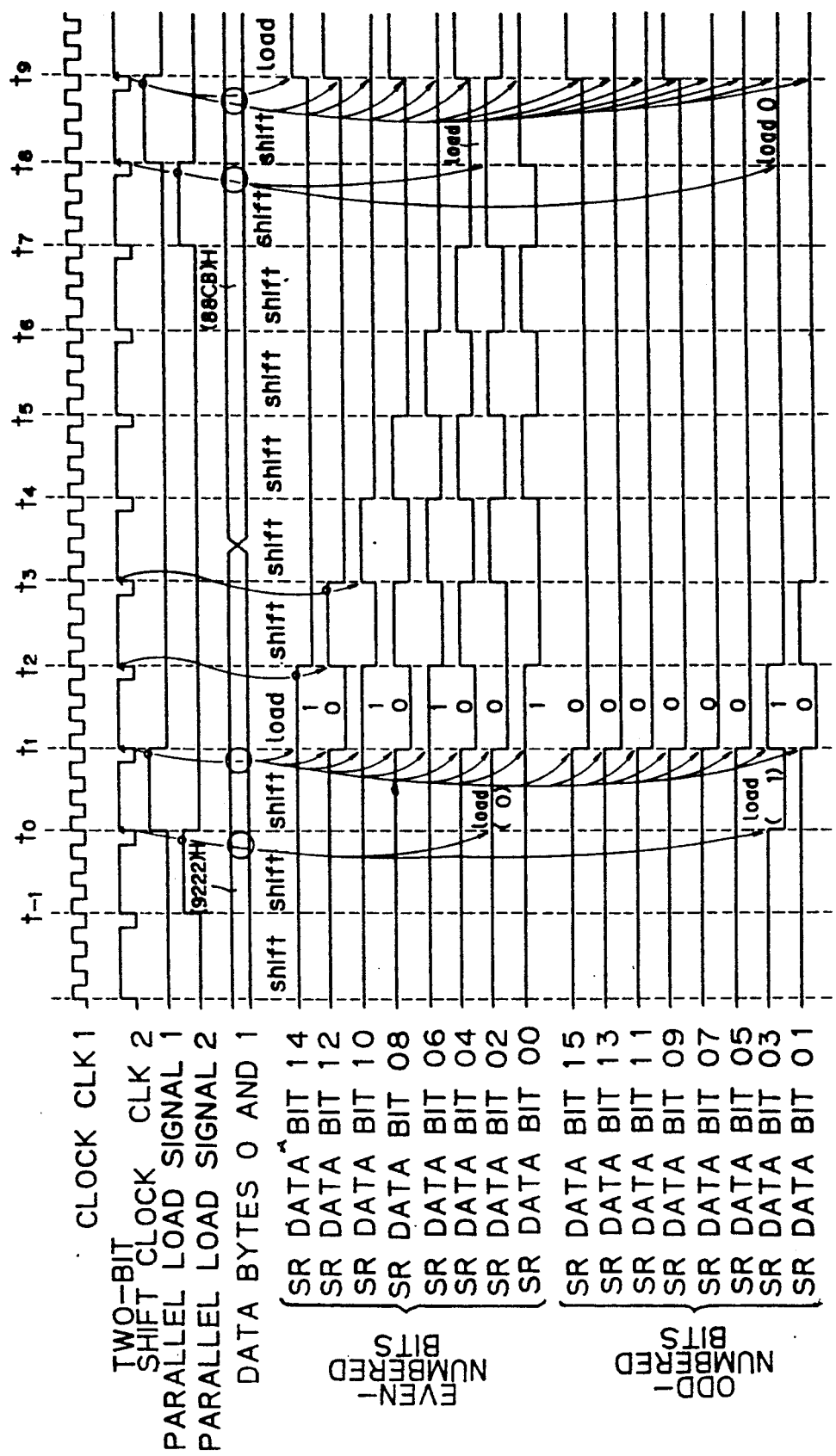
FIG. 13 shows the timing of the second embodiment of the encoding circuit according to the present invention.

FIG. 13 shows the timing of the second embodiment of the encoding circuit shown FIGS. 7 and 12. In the example shown in FIG. 13, the data which is first held in the data buffers 43 and 44, is again "9222" in hexadecimal notation. That is, "1010100100000010" in binary notation is first held in the data buffers 43 and 44. The multiplexers 60-0, 60-1, 60-2, 60-3, 60-4, 60-5, 60-6, 60-7, 60-8, 60-9, 60-10, 60-11, 60-12, and 60-13 in the shift registers 45' and 46' respectively select their inputs from the data buffers 43 and 44 when the above-mentioned multiplexer control signal 1 (parallel load signal 1) becomes active at the time to in the same manner as the first embodiment. Thus, each output bit of the data buffers 43 and 44 is entered in the corresponding flip-flop circuit through the corresponding multiplexer in the shift registers 45' and 46' (i.e., the data held in the data buffers 43 and 44 is loaded in parallel in the shift registers 45' and 46' at the time t1. From the time t2 to t9, the content of each flip-flop circuit is shifted by one bit in the direction from the No. 14 bit to the No. 00 bit in the shift register 45', and the content of each flip-flop circuit is shifted by one bit in the direction from the No. 15 bit to the No. 01 bit in the shift register 46' every time the two-bit shift clock CLK2 rises.

Thus, from the time t2 to t8, the bit of No. 2i (i=0 to 6) held in the data buffers 43 or 44, is applied to the input port b00 of the coding table 48, after being shifted through the flip-flop circuits 62-2i to 62-0. At the same time, the next bit of No. 2(i+1) is also applied to the input port b02 of the coding table 48, after being shifted through the flip-flop circuits 62-2(i+1) to 62-2. The bit of No. 2i+1 (i=0 to 6) held in the data buffers 43 and 44, is applied to the input port b01 of the coding table 48, after being shifted through the flip-flop circuits 62-2i+1 to 62-1. At the same time, the next bit of No. 2(i+1)+1 is also applied to the coding table 48 through the flip-flop circuits 62 2(i+1)+1 to 62-3, and the input port b03 of the coding table 48.

From the time t8 to t9, the bit of No. 14 held in the data buffers 43 and 44, is applied to the input port b00 of the coding table 48, after being shifted through the flip-flop circuits 62-14 to 62-0, and the bit of No. 15 held in the data buffers 43 and 44, is applied to the input port b01 of the coding table 48, after being shifted through the flip-flop circuits 62 15 to 62-1. On the other hand, the next two byte-data "88CB" in hexadecimal notation is held in the data buffers 43 and 44 between the times t3 and t4. As mentioned above, the multiplexer control signal 2 (parallel load signal 2) becomes active at the time t7, which is one cycle before the multiplexer control signal 1 (parallel load signal 1) becomes active. Corresponding to the above active multiplexer control signal 2 (parallel load signal 2), the bit of No. 00 in the above next data byte is applied through the multiplexer 60-2 to the flip-flop circuit 62-2, and the bit of No. 01 in the above next data byte is applied through the multiplexer 60-3 to the flip-flop circuit 62-3. Then, at the time t8, the above bits of Nos. 00 and 01 are respectively loaded in the flip-flop circuits 62-2 and 62-3. Thus, at the same time as the above bits of Nos. 14 and 15 from the flip-flop circuits 62-0 and 62-1, the above bits of Nos. 00 and 01 in the next data byte are respectively supplied to the coding table 48 from the flip-flop circuits 62-2 and 62-3.

All the other operations of the construction of FIG. 12 is the same as the operations of FIG. 10.

4. Third Embodiment

Figure 14:
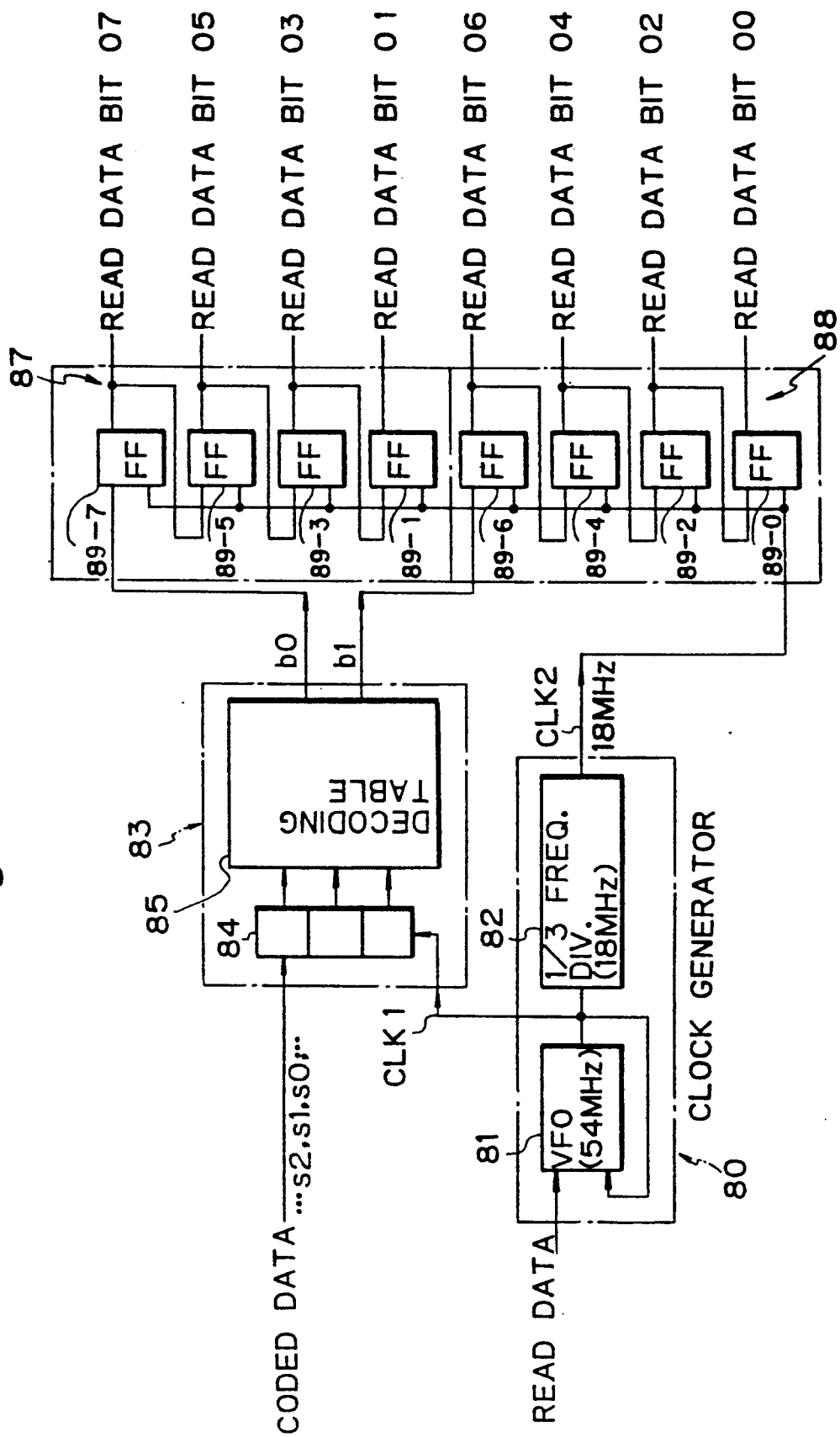
FIG. 14 shows the construction of the decoder circuit as the third embodiment of the present invention.

FIG. 14 shows the construction of a decoding circuit as the third embodiment of the present invention. In FIG. 14, reference numeral 80 denotes a clock generator, 81 denotes a variable frequency oscillator, 82 denotes a ⅓ frequency divider, 83 denotes a decoder, 84, 87, and 88 each denote a shift register, 85 denotes a decoding table, and 89-0 to 89-7 each denote a flip-flop circuit.

The variable frequency oscillator 81 generates a coded data shift clock CLK1 having a frequency of 54 MHz, and the ⅓ frequency divider generates a two-bit shift clock CLK2 having a frequency of 18 MHz by dividing the frequency of the coded data shift clock CLK1. The timing of the clock signals CLK1 and CLK2 of 54 MHz and 18 MHz which are generated in the clock generator 80 in FIG. 14, are the same as shown in FIG. 8.

Coded data . . . s0, s1, s2, . . . which has been read from a magnetic disc, is serially input into the shift register 84 in the decoder 83 synchronized with the above coded data shift clock CLK1 of 54 MHz. The shift register 84 contains three bits, and the parallel output of three bits from the shift register 84 is applied to the decoding table 85.

The decoding table 85 is constructed by a hardware logic circuit, and the above output bits from the shift register 84 are applied as an input of the hardware logic circuit. The hardware logic circuit 85 outputs decoded data b0 and b1 corresponding to the above input bits s0, s1, and s3, using three bits of coded data s-3, s-2, and s-1 preceding the above bits s0, s1, and s3, and further three bits s4, s5, and s6 following s0, s1, and s2, in accordance with the relationships of FIG. 4. The decoding table which carries out the conversion in accordance with the relationships of FIG. 4, is explained in the U.S. Pat. No. 4,488,142 to P. A. Franaszek and U.S. Pat. No. 4,866,544 to S. Hashimoto. The description of the decoding tables in U.S. Pat. No. 4,866,544 to S. Hashimoto is hereby incorporated by reference herein.

Figure 15:
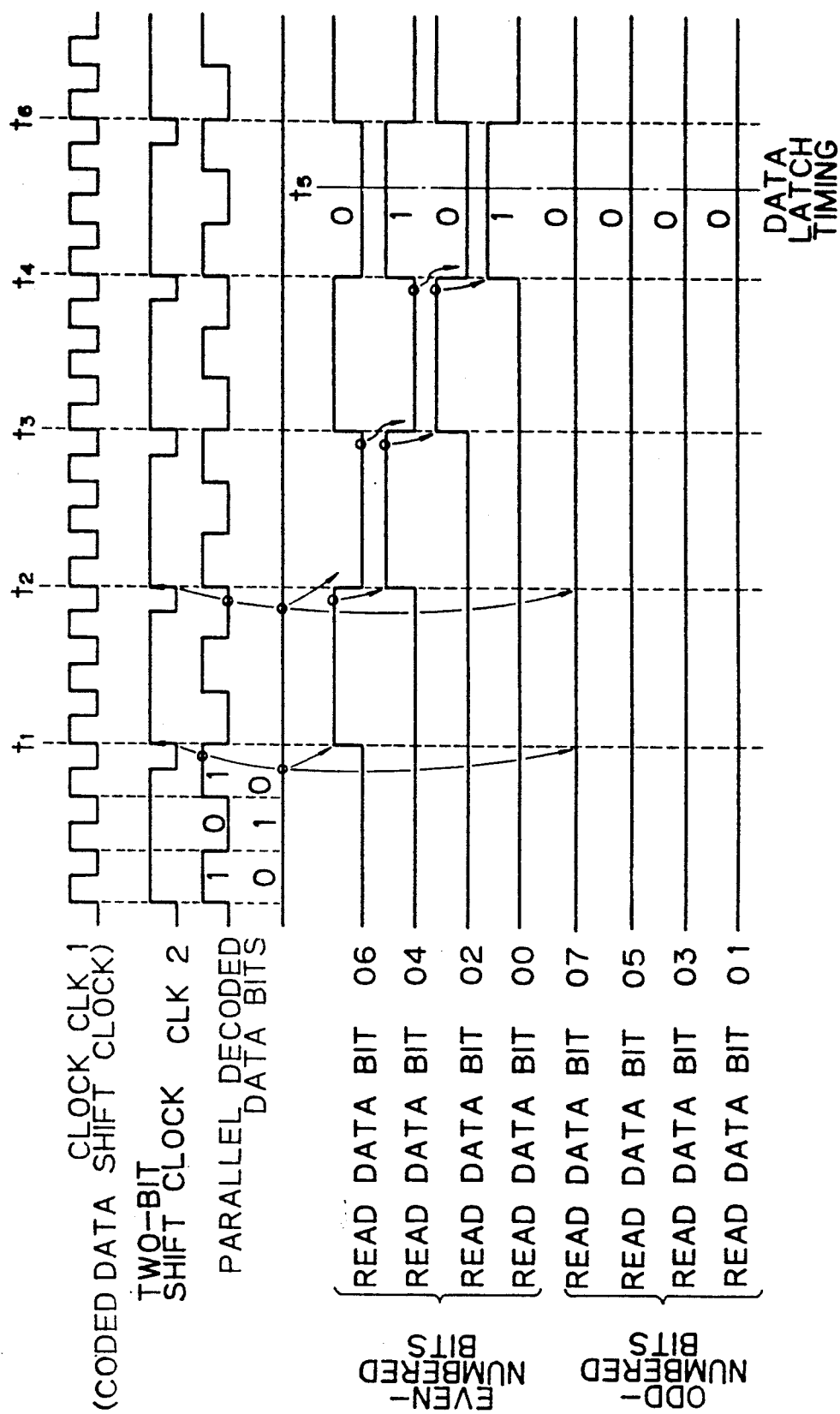
FIG. 15 shows the timing of the decoding circuit as the third embodiment of the present invention.

FIG. 15 shows the timing of the decoding circuit as the third embodiment of the present invention.

As shown in FIG. 15, although the input of the decoding table 85 changes synchronized with the coded data shift clock CLK1 of 54 MHz, the output bits b0 and b1 are respectively latched in the flip-flop circuits 89-7 and 89-6 synchronized with the two-bit shift clock CLK2 of 18 MHz.

The above output bit b0 is serially input into the shift register 87 synchronized with the above two bit shift clock CLK2 of 18 MHz, and at the same time, the above bit b1 is serially input into the shift register 88. In each of the shift registers 87 and 88, the above bit which is serially input therein is shifted by one bit in the direction from the flip-flop circuit 89-7 or 89-6 to the flip-flop circuit 89-1 or 89-0 when the two-bit shift clock CLK2 rises. Thus, the odd-numbered bits of the decoded data appear in the parallel output of the shift register 87, and the even-numbered bits of the decoded data appear in the parallel output of the shift register 88, as shown in FIG. 14. In the example shown in FIG. 15, after one byte data is loaded in the shift registers 87 and 88 at the time t4, the one byte data is latched at the time t5 for being read out.

5. Fourth Embodiment

Figure 16:
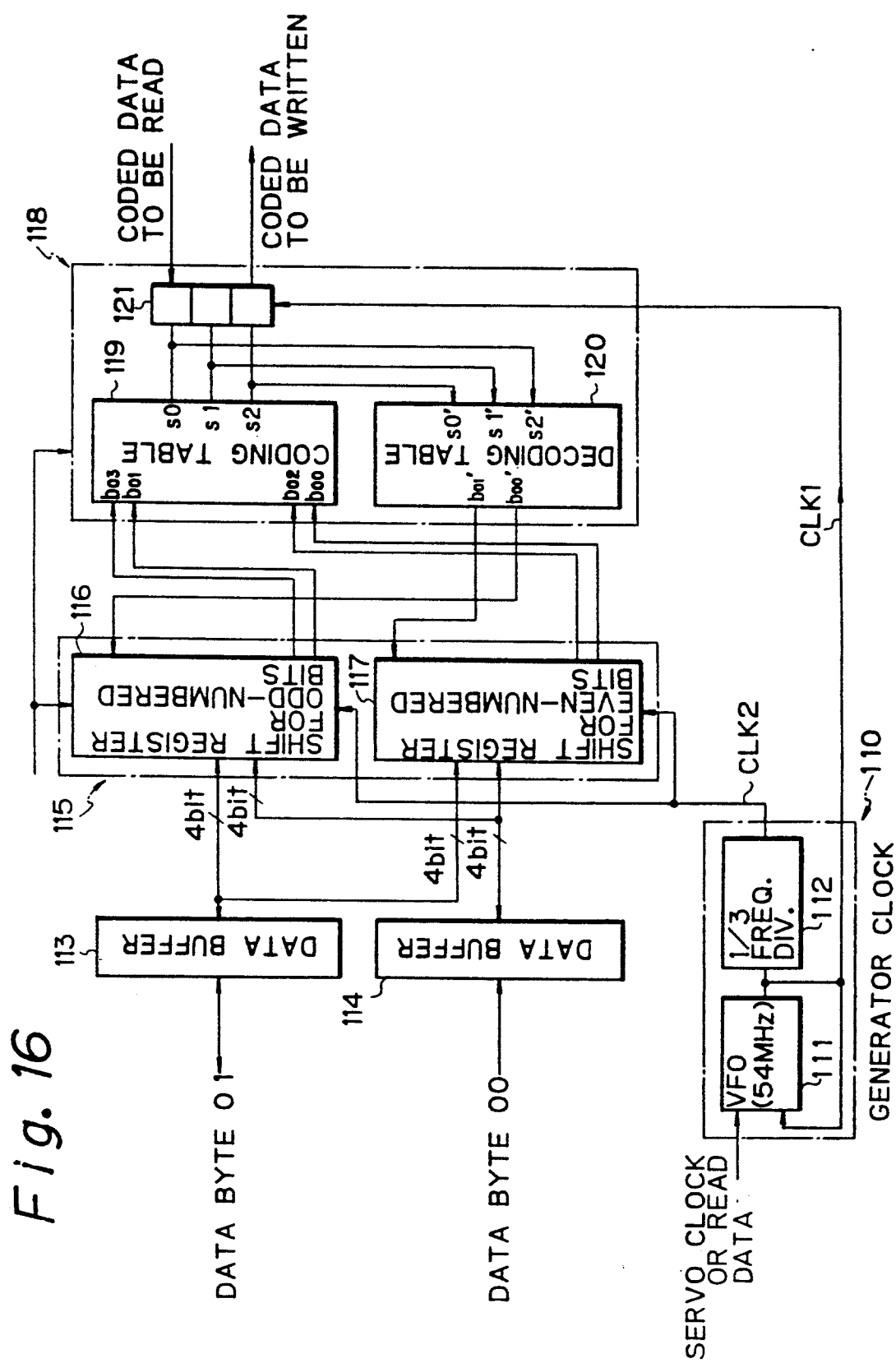
FIG. 16 shows the construction of the encoding and decoding circuit as the fourth embodiment of the present invention.

FIG. 16 shows the construction of an encoding and decoding circuit as the fourth embodiment of the present invention. The construction of FIG. 16 functions as an encoding circuit and as a decoder.

In FIG. 16, reference numeral 110 denotes a clock generator, 111 denotes a variable frequency oscillator, 112 denotes a ½ frequency divider, 113 and 114 each denote a data buffer, 116 and 117 each denote a shift register, 119 denotes an encoding table, 120 denotes a decoding table, and 121 denotes a shift register.

The construction of FIG. 16 except the decoding table 120 corresponds to the encoding circuit of FIG. 7. When writing data in the rotating disc medium, the data flows in the direction from the left to the right in FIG. 16.

The construction of FIG. 16 except the encoding table 119 operates in basically the same manner as the decoding circuit of FIG. 14, except that the shift registers 116 and 117 for loading odd-numbered bits and for loading even-numbered bits respectively contains eight bits as explained later with reference to FIGS. 17 and 18, and the outputs of the shift registers 116 and 117 are held in the data buffers 113 and 114 in the manner as explained later with reference to FIG. 19. When reading data in the rotating disc medium, the data flows in the direction from the right to the left in FIG. 16.

Figure 17:
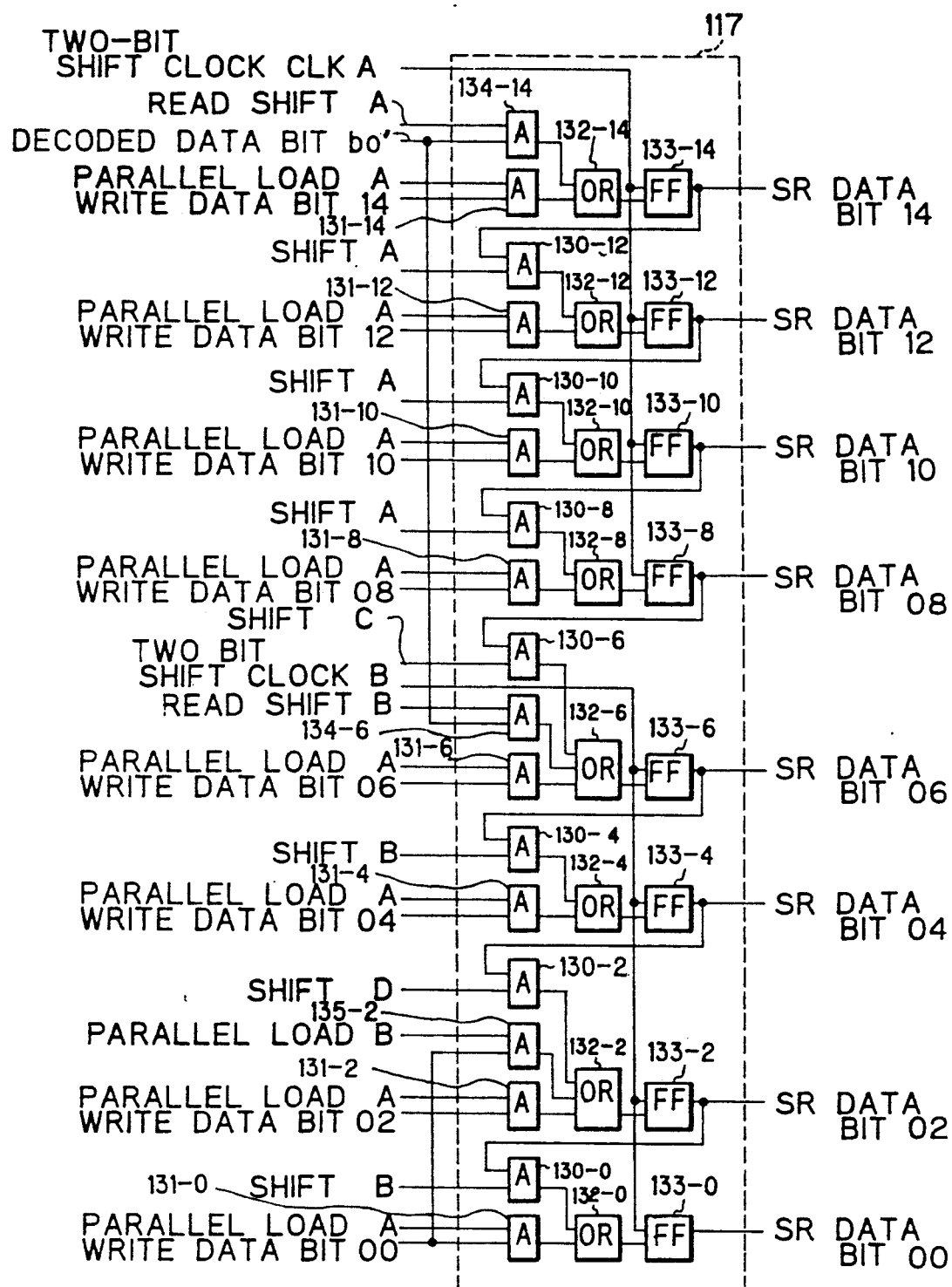
FIG. 17 shows the construction of the shift register 117 of FIG. 16.
Figure 18:
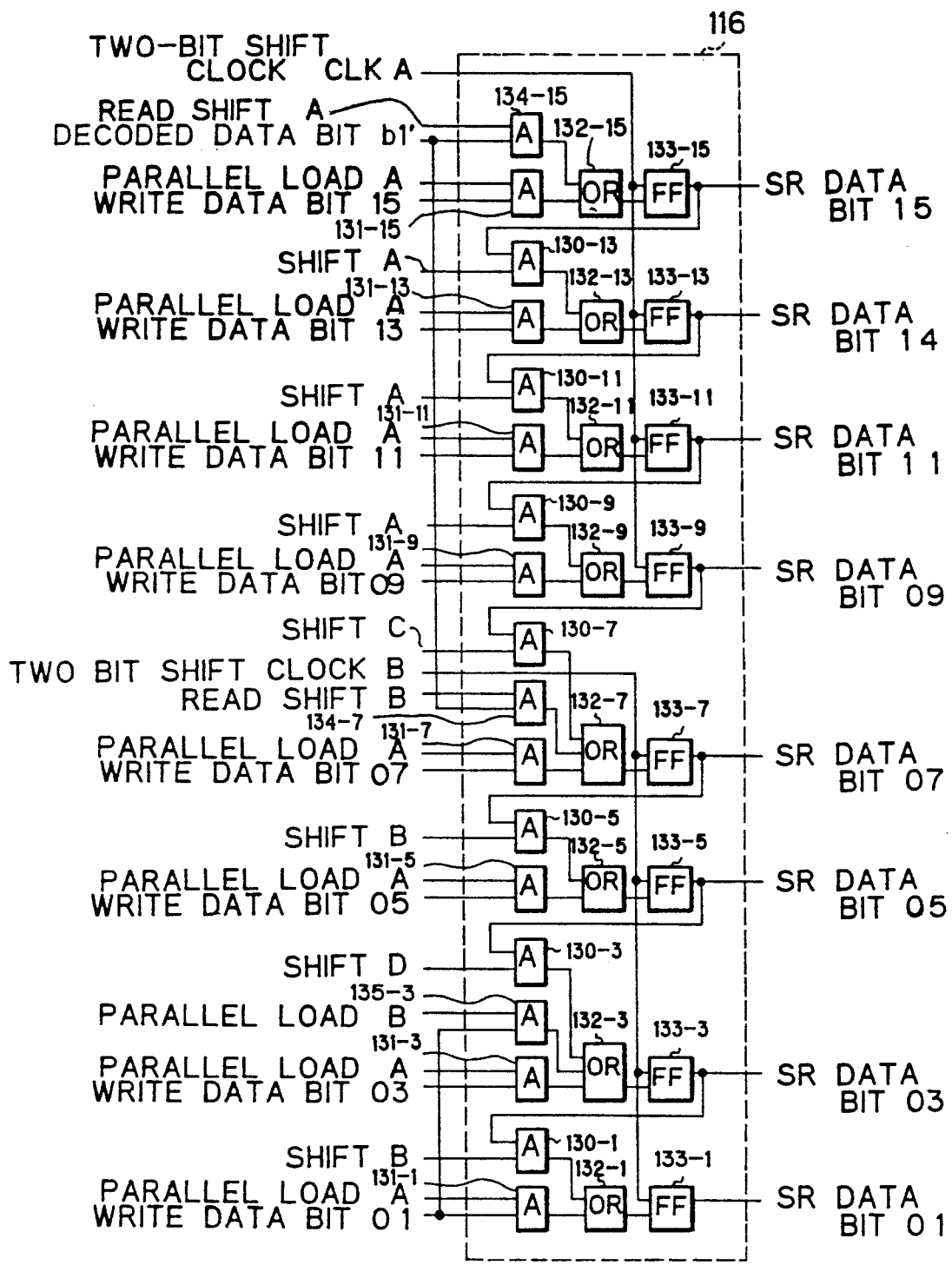
FIG. 18 shows the construction of the shift register 116 of FIG. 16.

FIGS. 17 and 18 respectively show the constructions of the shift registers 117 and 116 of FIG. 16. In FIG. 17, reference numeral 130-0, 130-2, 130-4, 130-6, 130-8, 130-10, 130-12, 131-0, 131-2, 131-4, 131-6, 131-8, 131-10, 131-12, 131-14, 134-6, 134-14, and 135-2 each denote an AND gate, 132-0, 132-2, 132-4, 132-6, 132-8, 132-10, 132-12, and 132-14 each denote an OR gate, and 133-0, 133-2, 133-4, 133-6, 133-8, 133-10, 133-12, and 133-14 each denote a flip-flop circuit. In FIG. 18, reference numeral 130-1, 130-3, 130-5, 130-7, 130-9, 130-11, 130-13, 131-1, 131-3, 131-5, 131-7, 131-9, 131-11, 131-13, 131-15, 134-7, 134-15, and 135-3 each denote an AND gate, 132-1, 132-3, 132-5, 132-7, 132-9, 132-11, 132-13, and 132-15 each denote an OR gate, and 133-1, 133-3, 133-5, 133-7, 133-9, 133-11, 133-13, and 133-15 each denote a flip-flop circuit.

In the construction of FIG. 17, the flip-flop circuits 133-2i (i=0 to 7) respectively receive as their inputs the outputs of corresponding OR gates 132-2i. The OR gates 132-2i (i=0 to 6) respectively receive as their inputs the outputs of corresponding two AND gates 130-2i and 131-2i, and the OR gate 132-14 receives the outputs of the AND gates 131-14 and 134.14. The AND gates 131-2i (i=0 to 7) receives a parallel load signal A in their one input terminal. When the output bits of the data buffer 113 are numbered as Nos. 15 to 08 from its most significant bit to its least significant bit, and the output bits of the data buffer 114 are numbered as Nos. 07 to 00 from its most significant bit to its least significant bit, the output bits No. 2i (i=0 to 7) of the data buffers 113 and 114 are respectively applied to the other input terminals of the AND gates 131-2i. When the output bits of the data buffer 113 are numbered as Nos. 15 to 08 from its most significant bit to its least significant bit, and the output bits of the data buffer 114 are numbered as Nos. 07 to 00 from its most significant bit to its least significant bit, the output bits No. 2i (i=0 to 7) of the data buffers 113 and 114 are respectively applied to the other input terminals of the AND gates 131-2i.

Similarly, in the construction of FIG. 18, the flip-flop circuits 133-2i+1 (i=0 to 7) respectively receive as their inputs the outputs of corresponding OR gates 132-2i+1. The OR gates 132-2i+1 (i=0 to 6) respectively receive as their inputs the outputs of corresponding two AND gates 130-2i+1 and 131-2i+1, and the OR gate 132-15 receives the outputs of the AND gates 131-15 and 134.15. The AND gates 131 2i+1 (i=0 to 7) receive a parallel load signal A in their one input terminal. The output bits No. 2i+1 (i=0 to 7) of the data buffers 113 and 114 are respectively applied to the other input terminals of the AND gates 131-2i+1.

In addition, in the constructions of FIGS. 17 and 18, the AND gates 131-2i (i=0 to 6) receives the output of the flip-flop circuit 133-2(i+1) (i=0 to 6) in their one input terminal, and the AND gates 131-2i+1 (i=0 to 6) receives the output of the flip-flop circuit 133 2(i+1)+1 (i=0 to 6) in their one input terminal. The AND gates 130-13 to 130-8 further receive a shift A signal in their other input terminals, the AND gates 130-0, 130-1, 130-4, and 130-5 further receive a shift B signal in their other input terminals, the AND gates 130-6, and 130-7 further receive a shift C signal in their other input terminals, and the AND gates 130-6, and 130-7 further receive a shift D signal in their other input terminals.

Further, in the construction of FIG. 17, the AND gate 134-14 receives a read shift A signal and a decoded data bit b0', and the AND gate 134-6 receives a read shift B signal and a decoded data bit b0'. The OR gate 132-2 further receives the output of the AND gate 135-2, and the AND gate 135-2 receives a parallel load signal B in its one input terminal, and the output bit No. 00 of the data buffers 114 in the other input terminal. In the construction of FIG. 18, the AND gate 134-15 receives a read shift A signal and a decoded data bit b1', and the AND gate 134-7 receives a read shift B signal and a decoded data bit b1'. The OR gate 132-3 further receives the output of the AND gate 135-3, and the AND gate 135-3 receives a parallel load signal B in its one input terminal, and the output bit No. 01 of the data buffers 114 in the other input terminal.

Furthermore, a two-bit shift clock A is applied to the edge-triggered input terminals of the flip-flop circuits 133-8 to 133-15, and a two-bit shift clock B is applied to the edge-triggered input terminals of the flip-flop circuits 133-0 to 133-7. Both the two-bit shift clocks A and B are the same as the aforementioned two-bit shift clock CLK2 in the first and second embodiments in the data writing (encoding) operation. In the data reading (decoding) operation, the two-bit shift clock A becomes active only when the aforementioned shift A signal is active, and the two-bit shift clock B becomes active only when the aforementioned shift B signal is active. The outputs of the flip-flop circuits 133-0 and 133-2 in the shift register 117 are supplied to the input terminals b00 and b02 of the coding table 119 of FIG. 16, and the outputs of the flip-flop circuits 133-1 and 133-3 in the shift register 116 are supplied to the input terminals b01 and b03 of the coding table 119 of FIG. 16.

In the data writing (encoding) operation, the above parallel load signal A is the same as the aforementioned parallel load signal 1, and the above parallel load signal B is the same as the parallel load signal 2 in the first and second embodiment. Namely, the parallel load signal A is a periodic signal having a frequency of 2.25 MHz, and is supplied to the constructions of FIGS. 17 and 18 for loading in parallel the outputs of the data buffers 113 and 114 in the flip-flop circuits 133-2i and 133-2i+1 (i=0 to 7). The parallel load signal B is a periodic signal having a frequency of 2.25 MHz, and is supplied to the constructions of FIGS. 17 and 18, at the timing one cycle before the parallel load signal A, so that the bits of Nos. 00 and 01 in a data byte next to the data byte the last two bits of which are output from the shift registers 116 and 117 to the coding table 119 at the moment, are respectively applied to the flip-flop circuits 132-2 and 132-3.

Figure 20:
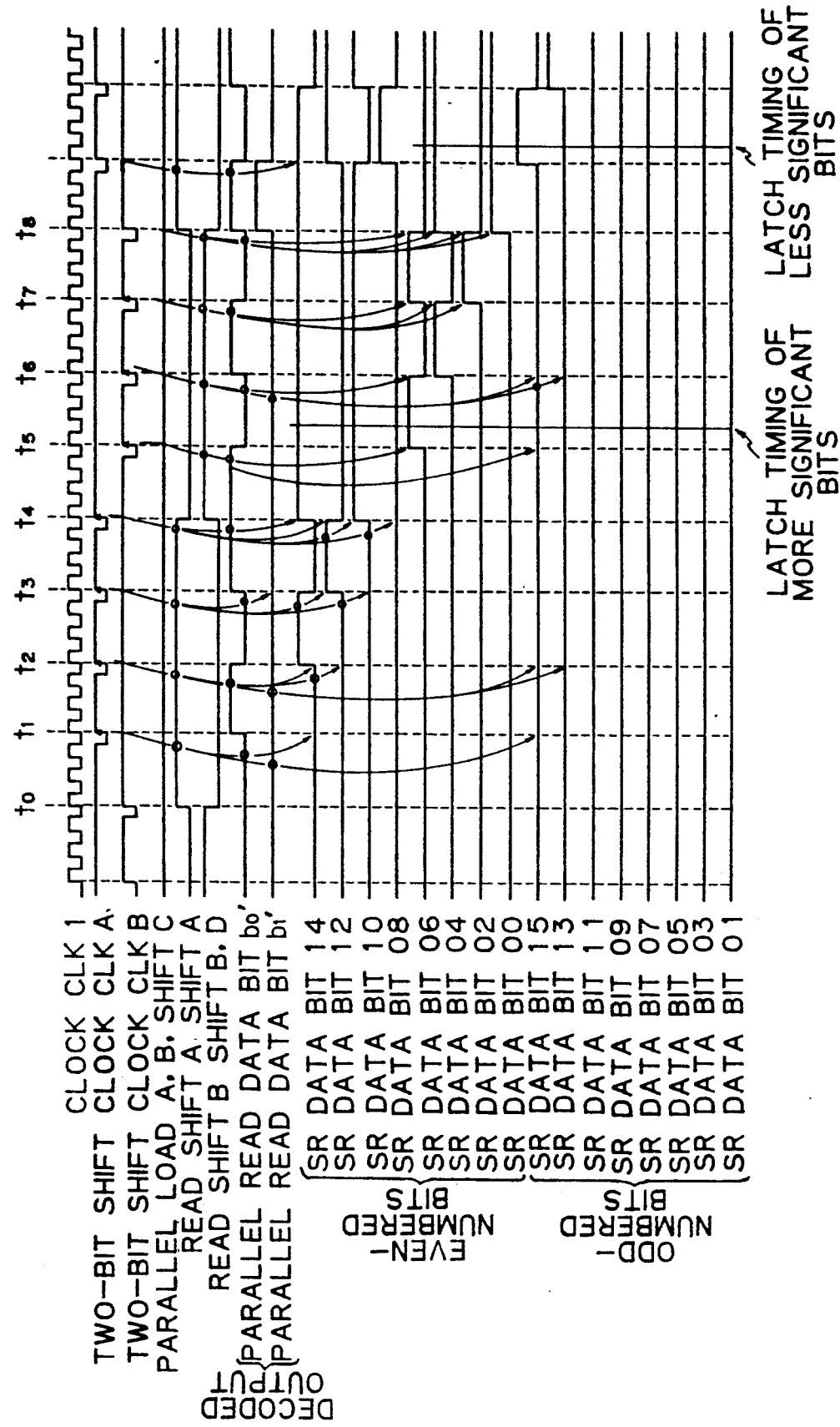
FIG. 20 shows the timing of the decoding operation in the encoding and decoding circuit of the fourth embodiment of the present invention.

The decoded data bits b0' and b1' are the output of the decoding table 120 in FIG. 16. The decoding table 120 in FIG. 16 is the same as the decoding table 85 in FIG. 14, receives through the shift register 121 at its input terminals s0', s1', and s2', a coded data bit sequence which has been read from a rotating disc medium, and converts the coded data bit sequence to decoded data bit sequence corresponding to the received coded data bit sequence to output the converted result as successive pair of bits synchronized with the system clock CLK1 of 54 MHz. The read shift A signal and the read shift signal B are each a periodic signal having a frequency of 4.5 MHz, and alternatively become active as shown in FIG. 20 when reading (decoding coded) data from the rotating disc medium.

The other operations of the constructions of FIGS. 17 and 18 including the above shift signals A, B, C, and D are explained below with reference to FIGS. 19 and 20.

Figure 19:
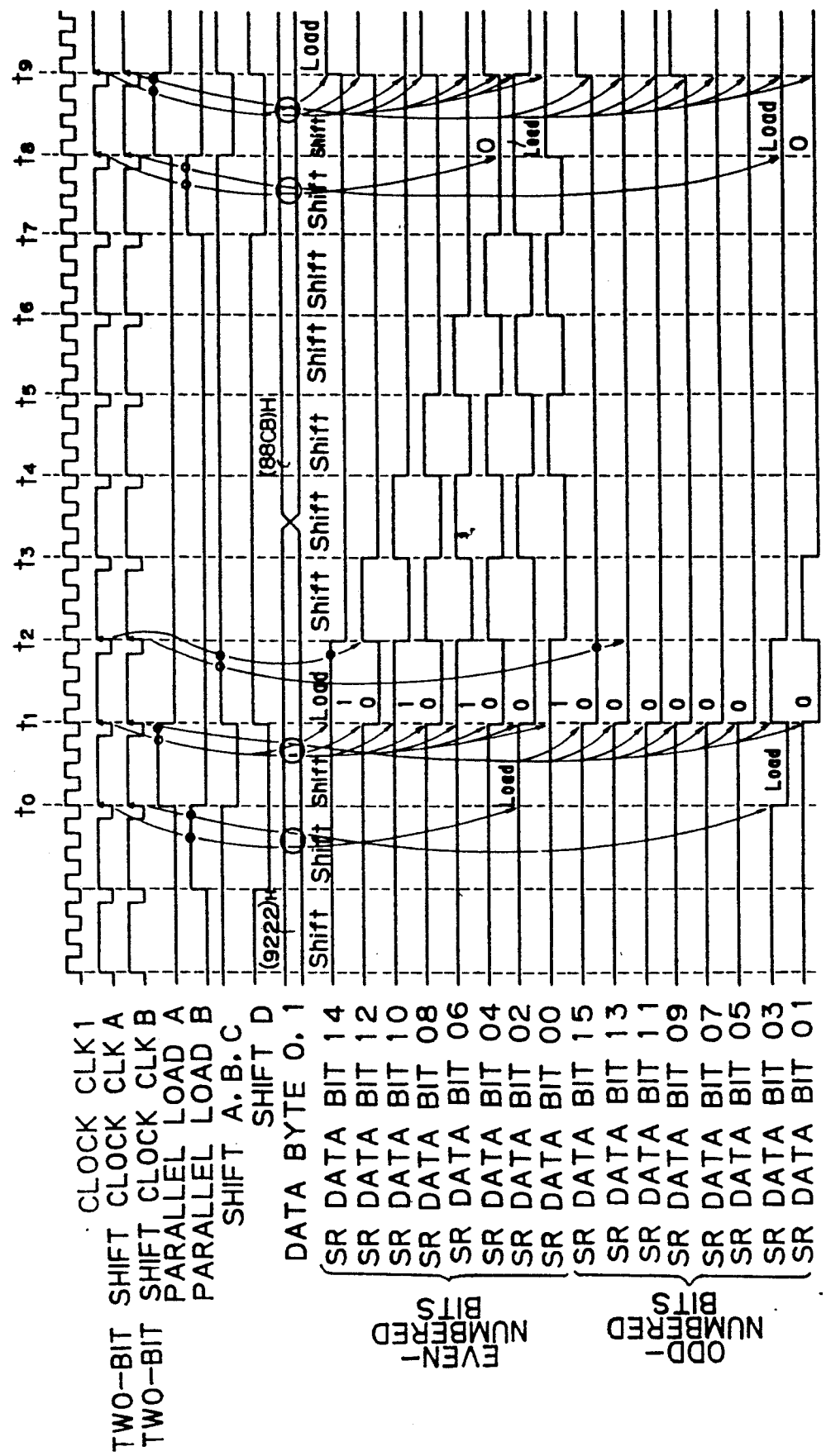
FIG. 19 shows the timing of the encoding operation in the encoding and decoding circuit of the fourth embodiment of the present invention.

FIG. 19 shows the timing of the encoding operation in the encoding and decoding circuit of FIGS. 16 and 17 as the fourth embodiment of the present invention.

In the example shown in FIG. 19, the data which is first held in the data buffers 113 and 114, is again "9222" in hexadecimal notation ("1010100100000010" in binary notation). At the time t0, the parallel load signal A becomes active. Corresponding to the active parallel load signal A, the output bits Nos. 00 to 15 of the data buffers 113 and 114 are entered in parallel in the corresponding flip-flop circuits in the shift registers 116 and 117 through the corresponding AND gates 131-j (j=0 to 15) and the OR gates 133-j (j=0 to 15) at the time t1. During the parallel loading, the shift signals A, B, C, and D are maintained inactive as shown in FIG. 19. Since, as shown in FIG. 19, the shift A, B, and C signals are active from the time t1 to t8, and the shift D signal are active from the time t1 to t7, the content of each flip-flop circuit is shifted by one bit in the direction from the No. 14 bit to the No. 00 bit in the shift register 117, and the content of each flip-flop circuit is shifted by one bit in the direction from the No. 15 bit to the No. 01 bit in the shift register 116 every time the two-bit shift clocks A and B rise.

Thus, from the time t2 to t8, the bit of No. 2i (i=0 to 6) held in the data buffers 113 or 114, is applied to the input port b00- of the coding table 119, after being shifted through the flip-flop circuits 133-2i to 133-0. At the same time, the next bit of No. 2(i+1) is also applied to the input port b02 of the coding table 119, after being shifted through the flip-flop circuits 133-2(i+1) to 133-2. The bit of No. 2i+1 (i=0 to 6) held in the data buffers 113 and 114, is applied to the input port b01 of the coding table 119, after being shifted through the flip-flop circuits 133-2i+1 to 133-1. At the same time, the next bit of No. 2(i+1)+1 is also applied to the coding table 119 through the flip-flop circuits 133-2(i+1)+1 to 133-3, and the input port b03 of the coding table 119.

From the time t8 to t9, the bit of No. 14 held in the data buffers 113 and 114, is applied to the input port b00 of the coding table 119, after being shifted through the flip-flop circuits 133-14 to 133-0, and the bit of No. 15 held in the data buffers 113 and 114, is applied to the input port b01 of the coding table 119, after being shifted through the flip-flop circuits 133-15 to 133-1. On the other hand, the next two byte-data "88CB" in hexadecimal notation is held in the data buffers 113 and 114 between the times t3 and t4. As mentioned above, the parallel load signal B becomes active at the time t7, which is one cycle before the parallel load signal A becomes active. Corresponding to the above active parallel load signal B, the bit of No. 00 in the above next data byte is applied through the AND gate 135-2 and the OR gate 132-2 to the flip-flop circuit 133-2, and the bit of No. 01 in the above next data byte is applied through the AND gate 135-3 and the OR gate 132-3 to the flip-flop circuit 133-3. Then, at the time ts, the above bits of Nos. 00 and 01 are respectively loaded in the flip-flop circuits 133-2 and 133-3. Thus, at the same time as the above bits of Nos. 14 and 15 from the flip-flop circuits 133-0 and 133-1, the above bits of Nos. 00 and 01 in the next data byte are respectively supplied to the coding table 119 from the flip-flop circuits 133-2 and 133-3.

FIG. 20 shows the timing of the decoding operation in the encoding and decoding circuit of the fourth embodiment of the present invention.

In the example shown in FIG. 20, from the time to t4, the read shift A signal and the shift A are active. Therefore, the decoded data bit b0' from the decoding table 120 is applied to the flip-flop circuit 133-14 through the AND gate 134.14 and the OR gate 132-14, and is latched in the flip-flop circuit 133-14 when the two-bit shift clock A rises. At the same time, the decoded data bit b1' from the decoding table 120 is applied to the flip-flop circuit 133-15 through the AND gate 134-15 and the OR gate 132-15, and is latched in the flip-flop circuit 133-15 when the two-bit shift clock A rises.

The data bits latched in the flip-flop circuits 133-2(i+1) (i=4 to 6) in FIG. 17 are shifted to the flip-flop circuit 133-2i through the AND gate 130-2i and the OR gate 132-2i when the two-bit shift clock A rises next, and the data bits latched in the flip-flop circuits 133-2(i+1)+1 (=i=4 to 6) in FIG. 18 are shifted to the flip-flop circuit 133-2i+1 through the AND gate 130-2i+1 and the OR gate 132-2i+1 when the two-bit shift clock A rises. Thus, at the same time t4, four successive decoded bits b0's are held in the flip-flop circuits 133-8 to 133-14 in FIG. 17, and four successive decoded bits b1's are held in the flip-flop circuits 133-9 to 133-15 in FIG. 18. Namely, one byte of decoded data is loaded in the upper half bits of the shift registers 117 and 116 at the time t4. Since the above two-bit shift clock A is inactive after the time t4, the above one byte of decoded data which is loaded in the upper half bits of the shift registers 117 and 116 is maintained until the time t8. The maintained one byte data is latched in the data buffers 113 of FIG. 16 after the time t5 as shown in FIG. 20.

Figure 21:
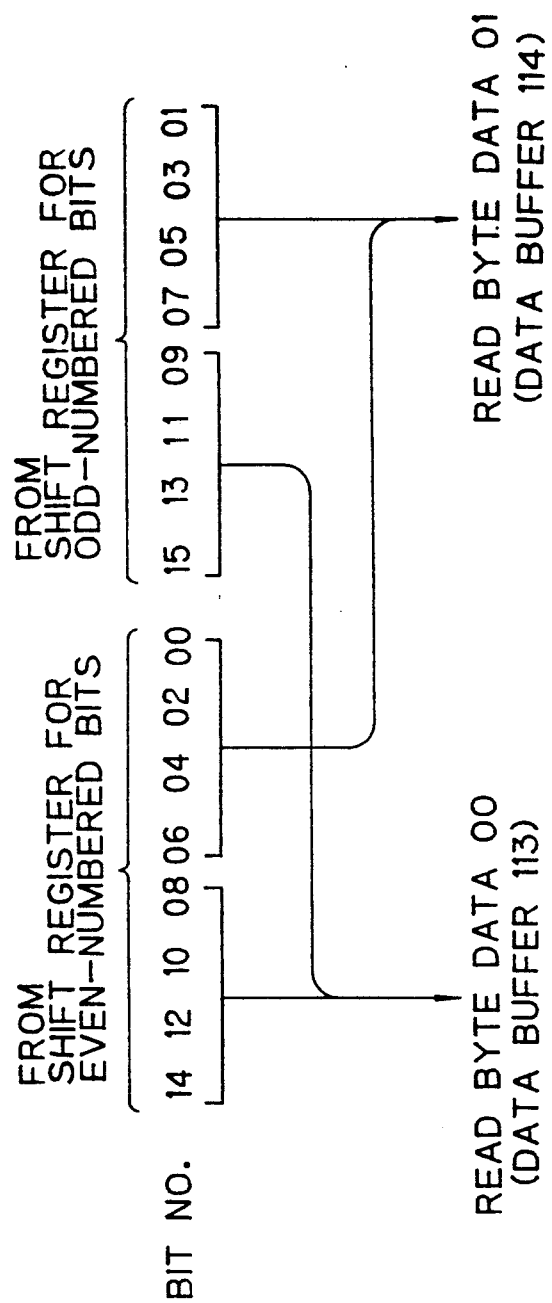
FIG. 21 shows the connection between the output bits of the buffer registers 113 and 114 and the input bits of the shift registers 116 and 117 in the construction of FIG. 16.

FIG. 21 shows the connection between the output bits of the buffer registers 113 and 114 and the input bits of the shift registers 116 and 117 in the construction of FIG. 16. A shown in FIG. 21, the above one byte data held in the upper halves of the shift registers 117 and 116 is latched in the data buffer 113.

From the time t4 to t8, the read shift B signal and the shift B are active, instead of the read shift A signal and the shift A. Therefore, the decoded data bit b0' from the decoding table 120 is applied to the flip-flop circuit 133-6 through the AND gate 134-6 and the OR gate 132-6, and is latched in the flip-flop circuit 133-6 when the two-bit shift clock B rises. At the same time, the decoded data bit b1' from the decoding table 120 is applied to the flip-flop circuit 133-7 through the AND gate 134-7 and the OR gate 132-7, and is latched in the flip-flop circuit 133-7 when the two-bit shift clock B rises.

The data bits latched in the flip-flop circuits 133-2(i+1) (i=0 to 2) in FIG. 17 are shifted to the flip-flop circuit 133-2i through the AND gate 130-2i and the OR gate 132-2i when the two-bit shift clock A rises next, and the data bits latched in the flip-flop circuits 133-2(i+1)+1 (i=0 to 2) in FIG. 18 are shifted to the flip-flop circuit 133-2i+1 through the AND gate 130-2i+1 and the OR gate 132-2i+1 when the two-bit shift clock A rises. Thus, at the time t8, four successive decoded bits b0's are held in the flip-flop circuits 133-0 to 133-6 in FIG. 17, and four successive decoded bits b1's are held in the flip-flop circuits 133-1 to 133-7 in FIG. 18. Namely, one byte of decoded data is loaded in the lower half bits of the shift registers 117 and 116 at the time t8. Since the above two-bit shift clock B is inactive after the time t8, the above one byte of decoded data which is loaded in the lower half bits of the shift registers 117 and 116 is maintained until the two-bit shift clock B becomes active again. The maintained one byte data is latched in the data buffer 114 of FIG. 16 after the time t8 as shown in FIG. 20. The combination between the outputs bits of the buffer registers 114 and the input bits of the shift registers 116 and 117 is also shown in FIG. 21, where the above one byte data held in the lower halves of the shift registers 117 and 116 is latched in the data buffer 114.

In all the above embodiments, all the control signals used therein are periodical, and therefore, are generated from the system clock of 54 MHz by dividing its frequency by suitable frequency dividing ratios, respectively.

We claim:

1. An encoding circuit for converting successive bits of original data to successive bits of coded data at a coding rate equal to m/n in accordance with a rule of a run-length-limited coding system, where m and n are each an integer satisfying m<n, comprising:
   a first clock generating means for generating a first clock;
   a frequency dividing means for dividing a frequency of said first clock by nr/m to generate a second clock, where r is an integer equal to or a divisor of the integer m;
   an encoder means for newly inputting parallel successive m bits in said successive bits of said original data, and outputting successive parallel n bits of coded data in each cycle of said second clock;
   r shift registers each for simultaneously inputting every r-th bit in each s successive bits in said successive bits of the original data, where r and s each is an integer satisfying 2r≦d, so that each of the s successive bits of the original data is input to one of the r shift registers without being doubly input into more than one shift register; and
   a serial output means for receiving in parallel said successive n bits output from said encoder means, and serially outputting said successive n bits in synchronization with said first clock;
   each of said r shift registers newly supply successive m/r bits of the bits held therein, to the encoder means in each cycle of said second clock.

2. An encoding circuit according to claim 1 wherein said integer r is equal to m.

3. An encoding circuit for converting successive bits of original data to successive bits of coded data at a coding rate equal to ⅔ in accordance with a rule of a run-length-limited coding system, comprising:
   a clock generating circuit for generating a first clock;
   a ≠ frequency dividing circuit for dividing a frequency of said first clock by three to generate a second clock;
   an encoder for newly inputting parallel successive two bits in said successive bits of said original data in each encoding cycle, and outputting successive three bits of coded data in each encoding cycle;
   a first shift registers means for simultaneously inputting even-numbered bits of each s successive bits of the original data, where s is an integer equal to or greater than four;
   a second shift register means for simultaneously inputting odd-numbered bits of each s successive bits of the original data; and
   an output shift register for receiving in parallel said successive three bits output from said encoder, and serially outputting the received successive three bits in synchronization with said first clock,
   each of said first and second shift registers newly supply one of the bits held therein, to the encoder, in each cycle of said second clock.

4. An encoding circuit according to claim 3, wherein said run-length-limited coding system is a (1,7) run-length-limited coding system,
   said encoded further inputs next two successive bits of said original data at the same time of the input of said successive two bits; and
   said first and second shift register means further output respectively and simultaneously a next one of the bits held therein, to the encoder, in synchronization with said second clock.

5. An encoding circuit according to claim 3, further comprising at least one data buffer register for holding at least a part of said original data which is to be encoded by said encoder, and outputting in parallel the data held therein to said first and second shift registers,
   even-numbered bits of said output of said data buffer register are connected to input terminals of said first shift register, and odd-numbered bits of said output of said data buffer register are connected to input terminals of said first shift register.

6. A decoding circuit for converting successive bits of coded data to successive bits of original data at a coding rate equal to m/n in accordance with a rule of a run-length-limited coding system, where m and n are each an integer satisfying m<n comprising:
   a first clock generating means for generating a first clock;
   a frequency dividing means for dividing a frequency of said first clock by nr/m to generate a second clock, where r is an integer, equal to or a divisor of the integer m;
   a decoder means for simultaneously inputting successive n bits in said successive bits of the coded data, and outputting successive m bits of the original data in each cycle of said second clock;
   r shift registers each for serially inputting every r-th bit of said successive m bits of the output of said decoder means in synchronization with said second clock, so that successive r bits of the output of said decoder means is simultaneously input to the r shift registers with no bit of the output being double input into more than one shift registers; and
   a serial input means for serially inputting said successive bits of the coded data which are to be decoded in the decoder means in synchronization with said first clock, and parallely supplying said successive n bits to the decoder mean for each cycle of said second clock.

7. A decoding circuit according to claim 6, wherein said integer r is equal to m.

8. A decoding circuit for converting successive bits of coded data to successive bits of original data at a coding rate equal to ⅔ in accordance with a rule of a run-length-limited coding system, comprising:
   a clock generating circuit for generating a first clock;
   a ⅓ frequency dividing circuit for dividing a frequency of said first clock by three to generate a second clock;
   a decoder for inputting parallel successive three bits in said successive bits of the coded data, and outputting successive two bits of the original data in each cycle of said second clock;
   a first shift register for serially inputting odd-numbered bits of said successive bits of the output of the decoder in synchronization with said second clock; and
   a second shift register for serially inputting even-numbered bits of said successive bits of the output of the decoder in synchronization with said second clock; and
   an input shift register for serially inputting said successive bits of the coded data to be decoded in said decoder in synchronization with said first clock, and parallely supplying said successive three bits to the decoder means for each cycle of said second clock.

9. A decoding circuit according to claim 8, wherein said run-length-limited coding system is a (1,7) run-length-limited coding system.

10. A decoding circuit according to claim 8, further comprising at least one data buffer register for receiving in parallel from said first and second shift registers and holding therein a part of said original data which has been decoded by said decoder,
   even-numbered bits of said output of said data buffer register are connected to input terminals of said first shift register, and odd-numbered bits of said output of said data buffer register are connected to input terminals of said first shift register.

11. An encoding and decoding circuit for converting successive bits of original data to successive bits of coded data at a coding rate equal to m/n in accordance with a rule of a run-length-limited coding system, and converting successive bits of coded data to successive bits of original data at a coding rate equal to m/n in accordance with the rule of the run-length-limited coding system, where m and n are each an integer satisfying m<n, comprising:
   a first clock generating means for generating a first clock;
   a frequency dividing means for dividing a frequency of said first clock by nr/m to generate a second clock, where r is an integer, which is equal to or a divisor of the integer m;
   an encoder means for newly inputting parallel successive m bits in said successive bits of said original data, and outputting in parallel successive n bits of coded data in each cycle of said second cycle;
   a decoder means for simultaneously inputting parallel successive n bits in said successive bits of the coded data, and outputting successive m bits of the original data in each cycle of said second clock;
   r shift registers each for inputting every r-th bit in each s successive bits in said successive bits of the original data, where r and s each is an integer satisfying 2r≦s, so that each of the successive bits of the original data are input to one of the r shift registers without being doubly input into more than one shift register when encoding the original data, and
   said r shift registers each serially inputting every r-th bit of said successive m bits of the output of said decoder means in synchronization with said second clock, so that successive r bits of the output of said decoder means are simultaneously input to the r shift registers with no bits of the output being doubly input into more than one shift register when decoding the coded data; and
   a serially output/input means for receiving in parallel said successive n bits which are output from said encoder means, and serially outputting said successive n bits in synchronization with said first clock, in the encoding operation, and serially inputting said successive bits of the coded data which are to be decoded in the decoder means in synchronization with said first clock, and parallely supplying said successive n bits to the decoder means for each cycle of said second clock, in the decoding operation,
   each of said r shift registers newly supply successive m/r bits of the bits held therein, to the encoder means, in each cycle of said second clock in the encoding operation.

12. An encoding circuit according to claim 1, wherein said integer r is equal to m.

13. An encoding/decoding circuit for converting successive bits of original data to successive bits of coded data at a coding rate equal to ⅔ in accordance with a rule of a run-length-limited coding system, and converting successive bits of the coded data to successive bits of the original data at the coding rate equal to ⅔ in accordance with the rule of the run-length-limited coding system, comprising:
   a clock generating circuit for generating a first lock;
   a ⅓ frequency dividing circuit for dividing a frequency of said first clock by three to generate a second clock;
   an encoder for newly inputted parallel successive two bits in said successive bits of said original data in each encoding cycle, and outputting parallel successive three bits of coded data in each encoding cycle;
   a decoder for inputting parallel successive three bits in said successive bits of the coded data, and outputting successive two bits of the original data in each cycle of said second clock;
   a first shaft register means for simultaneously inputting odd-numbered bits of said successive bits of the original data in an encoding operation; and serially inputting odd-numbered bits of said successive bits of the output of the decoder in synchronization with said second clock in a decoding operation; and
   a second shift register means for simultaneously inputting even-numbered bits of said successive bits of the original data in the encoding operation, and serially inputting even-numbered bits of said successive bits of the output of the decoder in synchronization with said second clock in the decoding operation; and an output/input shift register means for receiving said successive three bits output from said encoder, serially outputting the received successive three bits in synchronization with said first clock in the encoding operation, and serially inputting said successive bits of the coded data which are to be decoded in said decoder in synchronization with said first clock, and parallely supplying said successive three bits to the decoder means for each cycle of said second clock in the decoding operation, said first and second shift means newly supply each of one of the bits held therein, to the encoder, in each cycle of said second clock in the encoding operation.

14. An encoding and decoding circuit according to claim 13, wherein said run-length-limited coding system is a (1,7) run-length-limited coding system, said encoder further inputs next two successive bits of said original data at the same time as the input of said successive two bits; and said first and second shift means further output respectively and simultaneously a next one of the bits held therein, to the encoder, in synchronization with said second clock in the encoding operation.

15. An encoding and decoding circuit according to claim 13, further comprising at least one data buffer register for holding at least a part of said original data which is to be encoded by said encoder, and outputting in parallel the data held therein to said first and second shift registers in the encoding operation, and receiving in parallel from said first and second shift registers and holding therein a part of said original data which has been decoded by said decoder in the decoding operation, odd-numbered bits of said output of said data buffer register are connected to input terminals of said first shift register, and even-numbered bits of said output of said data buffer register are connected to input terminals of said second shift register, and odd-numbered bits of said input of said data buffer register are connected to output terminals of said first shift register, and even-numbered bits of said input of said data buffer register are connected to output terminals of said second shift register.

16. An encoding circuit according to claim 4, wherein said first shift register means further includes a first supplying means for receiving and supplying a first even-numbered bit of the original data followed said even-numbered bits of the s successive bits held therein, to the encoder, at the same time as the last one of the even-numbered bits of the s successive bits held therein is supplied to the encoder, and said second shift register means further includes a second supplying means for receiving and supplying a second odd-numbered bit of the original data following said even-numbered bits of the s successive bits held therein, to the encoder, at the same time as the last one of the odd-numbered bits of the s successive bits held therein is supplied to the encoder.

* * * * *